(12) United States Patent
Sugie

(10) Patent No.: US 12,738,816 B2
(45) Date of Patent: Sep. 15, 2026

(54) SEMICONDUCTOR DEVICE AND MOTOR DRIVING SYSTEM

(71) Applicant: Rohm Co., Ltd., Kyoto (JP)

(72) Inventor: Hisashi Sugie, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 531 days.

(21) Appl. No.: 18/005,275

(22) PCT Filed: Jun. 23, 2021

(86) PCT No.: PCT/JP2021/023767
§ 371 (c)(1),
(2) Date: Jan. 12, 2023

(87) PCT Pub. No.: WO2022/014283
PCT Pub. Date: Jan. 20, 2022

(65) Prior Publication Data

US 2023/0253862 A1 Aug. 10, 2023

(30) Foreign Application Priority Data

Jul. 13, 2020 (JP) ................................ 2020-119772

(51) Int. Cl.
*H02P 31/00* (2006.01)
*H02K 11/27* (2016.01)
(Continued)

(52) U.S. Cl.
CPC .............. *H02K 11/27* (2016.01); *H02P 21/22* (2016.02); *H02P 27/06* (2013.01); *H10W 70/465* (2026.01); *H10W 74/111* (2026.01)

(58) Field of Classification Search
CPC ........ H02P 27/08; H02P 6/085; H02P 29/032; H02P 6/14; H02P 2209/07; H02P 27/047;
(Continued)

(56) References Cited

U.S. PATENT DOCUMENTS

2007/0096278 A1* 5/2007 Nakatsu ................ H01L 25/072
257/E23.098
2014/0363926 A1* 12/2014 Fukuhara ................ H01L 24/06
438/123

(Continued)

FOREIGN PATENT DOCUMENTS

| | | |
|---|---|---|
| JP | 2017139892 | 8/2017 |
| JP | 2019204997 | 11/2019 |
| JP | 2020013955 | 1/2020 |

OTHER PUBLICATIONS

International Search Report in International Appln. No. PCT/JP2021/023767, dated Aug. 31, 2021, 5 pages (with English Translation).

*Primary Examiner* — Kawing Chan
*Assistant Examiner* — Charles S Laughlin
(74) *Attorney, Agent, or Firm* — Fish & Richardson P.C.

(57) ABSTRACT

A semiconductor device includes a semiconductor chip on which a semiconductor integrated circuit is formed, a plurality of leads disposed around the semiconductor chip, chip-directed wires connecting leads to the semiconductor chip, and a package sealing those. The semiconductor integrated circuit senses a sensing target current flowing through a sense resistor based on the voltage drop across the sense resistor, and performs predetermined operation based on the sensing result. The plurality of leads include a first and a second lead connected to one end and the other end of the sense resistor. The sense resistor is formed using a sensing metal member connecting between the first and second leads within the package without passing via the semiconductor chip.

9 Claims, 19 Drawing Sheets

(51) Int. Cl.
*H02P 21/22* (2016.01)
*H02P 27/06* (2006.01)
*H10W 70/40* (2026.01)
*H10W 74/10* (2026.01)

(58) Field of Classification Search
CPC .... H02P 6/08; H02P 6/16; H02P 6/182; H02P 6/28; H02P 21/00; H02P 29/40; H02P 1/18; H02P 25/12; H02P 6/20; H02P 6/34; H02P 7/04
See application file for complete search history.

(56) References Cited

U.S. PATENT DOCUMENTS

2015/0042373 A1* 2/2015 Nakamura ............. G01R 31/67 324/762.03
2017/0063367 A1* 3/2017 Tsurumaru ......... H03K 17/0828

* cited by examiner

FIG.1

SEMICONDUCTOR DEVICE AND MOTOR DRIVING SYSTEM

CROSS REFERENCE OF RELATED APPLICATIONS

This application is a U.S. National Phase application under 35 U.S.C. § 371 of International Patent Application No. PCT/JP2021/023767, filed on Jun. 23, 2021, which claims the priority of Japanese Patent Application No. 2020-119772, filed on Jul. 13, 2020, the disclosure of which is incorporated herein by reference in its entirety.

TECHNICAL FIELD

The present disclosure relates to semiconductor devices and motor driving systems.

BACKGROUND

Known motor driving systems include a three-phase motor, an inverter circuit that supplies each coil of the three-phase motor with a coil current, and a motor control device that controls the rotation of the three-phase motor by controlling the inverter circuit based on the result of sensing of the coil current of each phase. In such motor driving systems, the motor control device is often configured as a semiconductor device (what is called a motor driver IC) having a semiconductor integrated circuit housed in a package.

In a system where a coil current to be sensed is comparatively high (e.g., 10 A or over 10 A), it is customary to connect, externally to the semiconductor device, a sense resistor (with a resistance value of about 10 mΩ) for sensing the coil current and feed the semiconductor device, from outside, with a signal indicating the voltage across the sense resistor.

CITATION LIST

Patent Literature

Patent Document 1: JP-A-2017-139892

SUMMARY

Technical Problem

Inconveniently, the resistance value of the sense resistor externally connected to the semiconductor device is prone to individual variation, and variation of the resistance value of the sense resistor degrades the accuracy of current sensing and hence makes it difficult to achieve desired motor control (e.g., vector control). A sense resistor may be incorporated in the semiconductor device but, in cases where the current to be sensed is high (e.g., 10 A or over 10 A), that is not easy to implement because of the heat and the like to be coped with.

While circumstances associated with current sensing has been discussed in connection with motor driving systems, similar circumstances are encountered not only with motor driving systems but also with various devices and systems that require current sensing.

The present disclosure relates to a semiconductor device that enables satisfactory current sensing by use of a resistive component within a package, and also relates to a motor driving system that employs such a semiconductor device.

Solution to Problem

According to one aspect of the present disclosure, a semiconductor device includes: a semiconductor chip on which a semiconductor integrated circuit is formed; a plurality of leads disposed around the semiconductor chip; two or more chip-directed wires connecting two or more leads included in the plurality of leads to the semiconductor chip; and a package including a sealing resin and sealing the semiconductor chip, the plurality of leads, and the two or more chip-directed wires such that part of each of the plurality of leads is exposed out of the sealing resin. The semiconductor integrated circuit includes: a current sensing circuit configured to sense a sensing target current flowing through a sense resistor based on the voltage drop across the sense resistor; and a main circuit configured to perform predetermined operation based on the result of sensing of the sensing target current. The plurality of leads include a first lead and a second lead connected to one end and the other end, respectively, of the sense resistor. The sense resistor is formed by use of a sensing metal member that connects between the first and second leads within the package without passing via the semiconductor chip. (A first configuration.)

Advantageous Effects of Disclosure

According to the present disclosure, it is possible to provide a semiconductor device that enables satisfactory current sensing as well as a motor driving system that employs such a semiconductor device.

BRIEF DESCRIPTION OF DRAWINGS

FIG. 1 is an overall configuration diagram of a motor driving system according to a first embodiment of the present disclosure.

DESCRIPTION OF EMBODIMENTS

Figure 2:
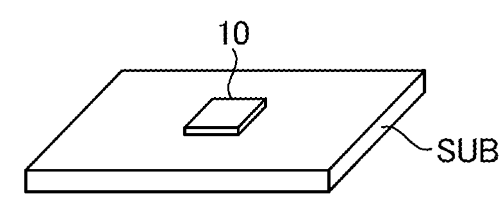
FIG. 2 is a diagram showing a semiconductor device mounted on a circuit board in connection with the first embodiment of the present disclosure.

Hereinafter, examples of implementing the present disclosure will be described specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the high-side transistor described later and identified by the reference sign "MH[1]" (see FIG. 1) is sometimes referred to as the high-side transistor MH[1] and other times abbreviated to the transistor MH[1], both referring to the same entity.

First, some of the terms used to describe embodiments of the present disclosure will be defined. "Ground" refers to a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground. "Level" denotes the level of a potential, and for any signal or voltage, "high level" has a higher potential than "low level".

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply for any transistor that is not classified as an FET. Unless otherwise stated, any MOSFET can be understood to be an enhancement MOSFET. "MOSFET" is an abbreviation of "metal-oxide-semiconductor field-effect transistor". For any transistor, its being in the on or off state is occasionally expressed simply as its being on or off respectively.

First Embodiment

Figure 1:
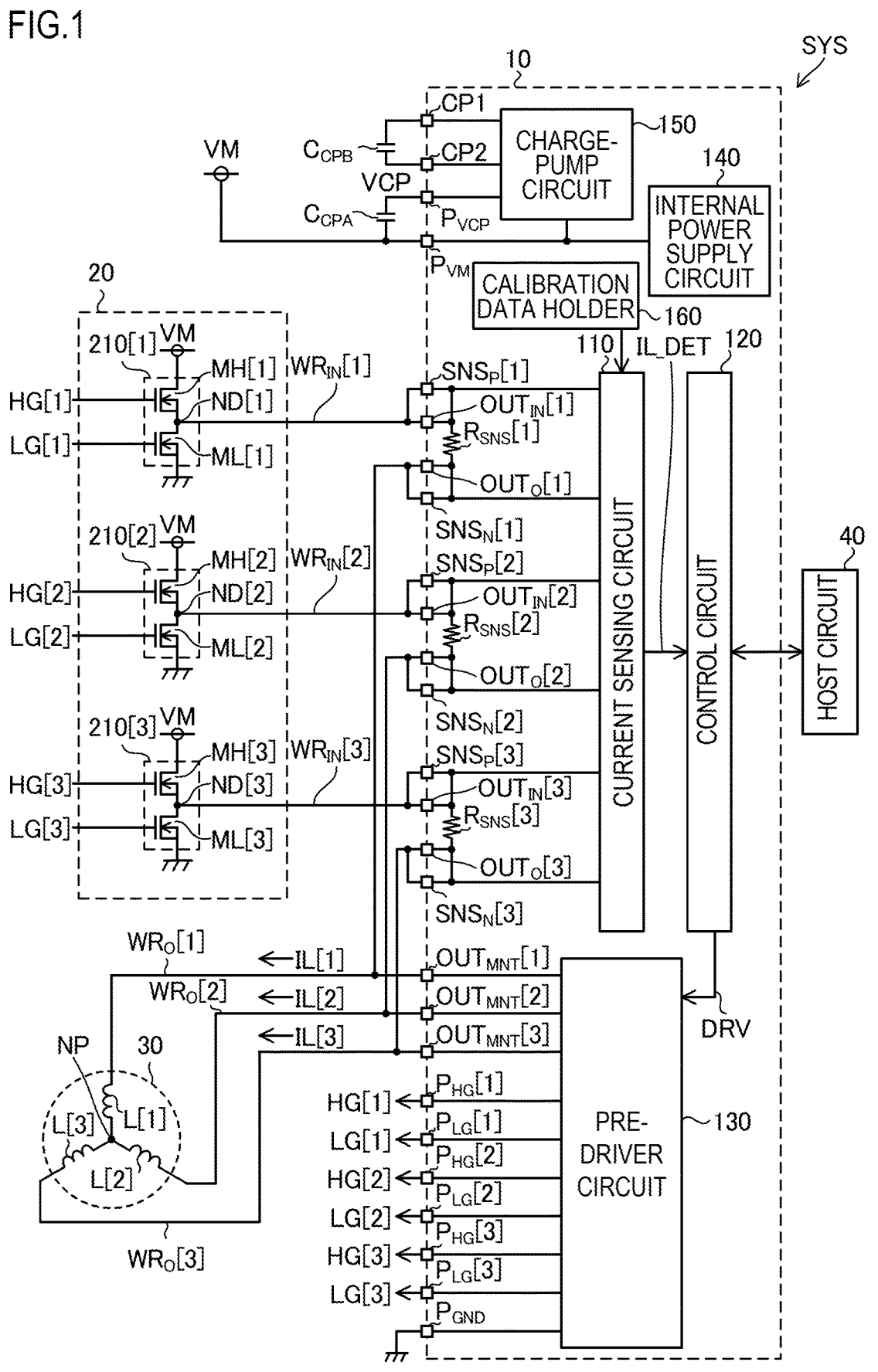

A first embodiment of the present disclosure will be described. FIG. 1 shows an overall configuration of a motor driving system SYS according to the first embodiment. The motor driving system SYS includes a semiconductor device 10 that functions as a motor control device, an inverter circuit 20, a three-phase motor 30, and a host circuit 40 that is configured with an MPU (microprocessor unit) or the like.

The three-phase motor 30 is a three-phase brushless synchronous motor that has star-connected three-phase coils L[1], L[2], and L[3]. The coils L[1], L[2], and L[3] correspond to U-, V-, and W-phase coils respectively, and in this embodiment the U, V, and W phases are referred to as a first, a second, and a third phase respectively. The first, second, and third phases share a common circuit configuration. Accordingly, in the following description of the configurations and other features of various circuits, the symbol "i" representing any integer will be used as necessary: any circuit, element, physical quantity, or the like that is identified by a symbol suffixed with "[i]" (e.g., L[i]) is that circuit, element, physical quantity, or the like for the ith phase.

The three-phase motor 30 has a stator and a rotor, with the latter fitted with a permanent magnet. The stator has coils L[1], L[2], and L[3]. One terminal of the coil L[1] is connected across an external wiring $WR_O$[1] to each of external terminals $OUT_O$[1], $SNS_N$[1], and $OUT_{MNT}$[1], which will be described later. One terminal of the coil L[2]

is connected across an external wiring $WR_O$[2] to each of external terminals $OUT_O$[2], $SNS_N$[2], and $OUT_{MNT}$[2], which will be described later. One terminal of the coil L[3] is connected across an external wiring $WR_O$[3] to each of external terminals $OUT_O$[3], $SNS_N$[3], and $OUT_{MNT}$[3], which will be described later. The other terminals of the coils L[1] to L[3] are connected together at a neutral point NP. The external wirings $WR_O$[1] to $WR_O$[3], and also the external wirings $WR_{IN}$[1] to $WR_{IN}$[3] described later, are wiring provided outside the semiconductor device 10, and include wiring patterns on a circuit board (the circuit board SUB described later) on which the semiconductor device 10 is to be mounted. FIG. 2 shows the circuit board SUB with the semiconductor device 10 mounted on it. Note however that, in FIG. 2, except the semiconductor device 10 the components mounted on the circuit board SUB are omitted from illustration and so are the wiring patterns on it.

The currents that flow through the coils L[1], L[2], and L[3] will be referred to as coil currents IL[1], IL[2], and IL[3] respectively. If the regeneration of electric power by the three-phase motor 30 is ignored, the coil currents IL[1], IL[2], and IL[3] flow respectively from the external terminals $OUT_O$[1], $OUT_O$[2], and $OUT_O$[3] to the neutral point NP. In the following description, unless otherwise stated, it is assumed that the coil current IL[i] flows from the external terminal $OUT_O$[i] to the neutral point NP.

The semiconductor device 10 is fabricated by housing and sealing a semiconductor chip having a semiconductor integrated circuit formed on it in a package formed of sealing resin. The semiconductor device 10 has a plurality of external terminals provided so as to be exposed out of its package.

In the semiconductor device 10 of the configuration example in FIG. 1, the plurality of external terminals mentioned above include external terminals CP1 and CP2 for charge pumping, external terminals $P_{VCP}$ and $P_{VM}$ for application of a supply voltage, external terminals $OUT_{IN}$[1] to $OUT_{IN}$[3] and $OUT_O$[1] to $OUT_O$[3] for passage of coil currents, external terminals $SNS_P$[1] to $SNS_P$[3] and $SNS_N$[1] to $SNS_N$[3] for sensing of the coil currents, external terminals $OUT_{MNT}$[1] to $OUT_{MNT}$[3] for monitoring of coil terminal voltages, external terminals $P_{HG}$[1] to $P_{HG}$[3] and $P_{LG}$[1] to $P_{LG}$[3] for output of gate signals, and an external terminal $P_{GND}$ as a ground terminal. The external terminal $P_{GND}$ is connected to the ground. Though not illustrated in FIG. 1, the plurality of external terminals mentioned above also include a group of terminals for communication which includes two or more external terminals, and via this group of terminals for communication, communication is conducted between the semiconductor device 10 (the control circuit 120 described below) and the host circuit 40. The semiconductor device 10 may further include any other external terminals.

The inverter circuit 20 includes a first-phase half-bridge circuit 210[1], a second-phase half-bridge circuit 210[2], and a third-phase half-bridge circuit 210[3] and, under the control of the semiconductor device 10, supplies the coils L[1] to L[3] with the coil currents IL[1] to IL[3].

The half-bridge circuits 210[1], 210[2], and 210[3] each include a high-side transistor and a low-side transistor connected in series between a line to which a supply voltage VM is applied and the ground. The supply voltage VM is a predetermined positive direct-current voltage. The high-side and low-side transistors are each configured as an N-channel MOSFET (metal-oxide-semiconductor field-effect transistor). The high-side and low-side transistors in the half-bridge circuit 210[i] will be identified by MH[i] and ML[i] respectively.

In each of the half-bridge circuits 210[1] to 210[3], the drain of the high-side transistor MH[i] is connected to a power terminal to which the supply voltage VM is applied, and is fed with the supply voltage VM. The source of the high-side transistor MH[i] and the drain of the low-side transistor ML[i] are connected together at a node ND[i]. The source of the low-side transistor ML[i] is connected to the ground.

The connection node ND[1] between the transistors MH[1] and ML[1] is connected across the external wiring $WR_{IN}$[1] to each of the external terminals $OUT_{IN}$[1] and $SNS_P$[1]. The connection node ND[2] between the transistors MH[2] and ML[2] is connected across the external wiring $WR_{IN}$[2] to each of the external terminals $OUT_{IN}$[2] and $SNS_P$[2]. The connection node ND[3] between the transistors MH[3] and ML[3] is connected across the external wiring $WR_{IN}$[3] to each of the external terminals $OUT_{IN}$[3] and $SNS_P$[3].

The semiconductor device 10 incudes a current sensing circuit 110, a control circuit 120, a pre-driver circuit 130, an internal power supply circuit 140, a charge-pump circuit 150, a calibration data holder 160, and sense resistors $R_{SNS}$[1], $R_{SNS}$[2], and $R_{SNS}$[3]. The external terminal $P_{VM}$ is fed with the supply voltage VM from outside the semiconductor device 10. Outside the semiconductor device 10, a capacitor $C_{CPA}$ is provided between the external terminals $P_{VCP}$ and $P_{VM}$, and a capacitor $C_{CPB}$ is provided between the external terminals CP1 and CP2. The charge-pump circuit 150 is connected to the external terminals CP1, CP2, $P_{VCP}$, and $P_{VM}$, and generates a supply voltage VCP by boosting (stepping up) the supply voltage VM using the capacitors $C_{CPA}$ and $C_{CPB}$. The supply voltage VCP is a direct-current voltage higher (e.g., 5 V higher) than the supply voltage VM. A voltage corresponding to the potential difference between the supply voltages VM and VCP is applied across the $C_{CPA}$, so that the supply voltage VCP appears at the external terminal $P_{VCP}$. The internal power supply circuit 140 generates one or more internal supply voltages based on the supply voltage VM. The circuits within the semiconductor device 10 operate based on the internal supply voltage.

The sense resistor $R_{SNS}$[i] is a resistor provided within the semiconductor device 10 for the sensing of the coil current IL[i]. Accordingly, one and the other terminals of the sense resistor $R_{SNS}$[1] are connected to the external terminals $OUT_{IN}$[1] and $OUT_O$[1] respectively, one and the other terminals of the sense resistor $R_{SNS}$[2] are connected to the external terminals $OUT_{IN}$[2] and $OUT_O$[2] respectively, and one and the other terminals of the sense resistor $R_{SNS}$[3] are connected to the external terminals $OUT_{IN}$[3] and $OUT_O$[3] respectively.

For the first phase, the external terminals $OUT_{IN}$[1] and $SNS_P$[1] are short-circuited together by part of the external wiring $WR_{IN}$[1], and the external terminals $OUT_O$[1] and $SNS_N$[1] are short-circuited together by part of the external wiring $WR_O$[1]. A similar description applies to the second and third phases. Specifically, the external terminals $OUT_{IN}$[i] and $SNS_P$[i] are short-circuited together by part of the external wiring $WR_{IN}$[i], and the external terminals $OUT_O$[i] and $SNS_N$[i] are short-circuited together by part of the external wiring $WR_O$[i]. Accordingly, with respect to the ith phase, as the coil current IL[i] flows through the sense resistor $R_{SNS}$[i], a voltage drop commensurate with the coil current IL[i] occurs across the sense resistor $R_{SNS}$[i], and the voltage drop across the sense resistor $R_{SNS}$[i] is applied between the external terminals $SNS_P$[i] and $SNS_N$[i]. Moreover, with respect to each of the first to third phases, within the package of the semiconductor device 10, the external terminals $SNS_P$[i] and $OUT_{IN}$[i] are short-circuited together and the external terminals $SNS_N$[i] and $OUT_O$[i] are short-circuited together; a configuration for achieving these short circuits will be described later.

The current sensing circuit 110 is connected to the external terminals $SNS_P$[1] to $SNS_P$[3] and $SNS_N$[1] to $SNS_N$[3]; it senses the coil current IL[1] based on the voltage between the external terminals $SNS_P$[1] and $SNS_N$[1], senses the coil current IL[2] based on the voltage between the external terminals $SNS_P$[2] and $SNS_N$[2], and senses coil current IL[3] based on the voltage between the external terminal $SNS_P$[3] and $SNS_N$[3]. Sensing the coil current IL[i] denotes sensing the current value of the coil current IL[i]. The current values of the coil currents IL[1], IL[2], and IL[3] as detected by the current sensing circuit 110 will be referred to as the detected current values VAL_IL[1], VAL_IL[2], and VAL_IL[3] respectively. A signal IL_DET indicating the detected current values VAL_IL[1], VAL_IL[2], and VAL_IL[3] is fed from the current sensing circuit 110 to the control circuit 120. The signal IL_DET is generated with reference to calibration information held in the calibration data holder 160. The calibration information will be described later.

Figure 3:
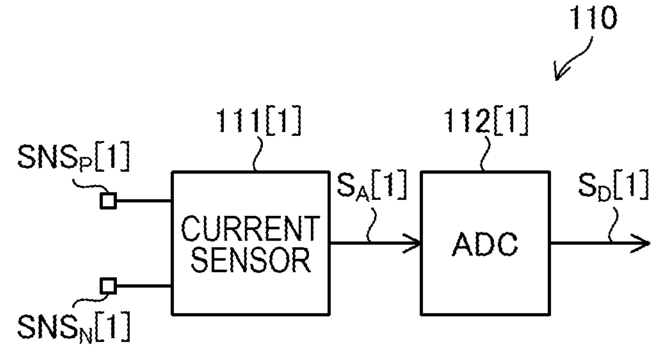
FIG. 3 is a diagram showing an example of the internal configuration of the current sensing circuit in FIG. 1.
Figure 3:
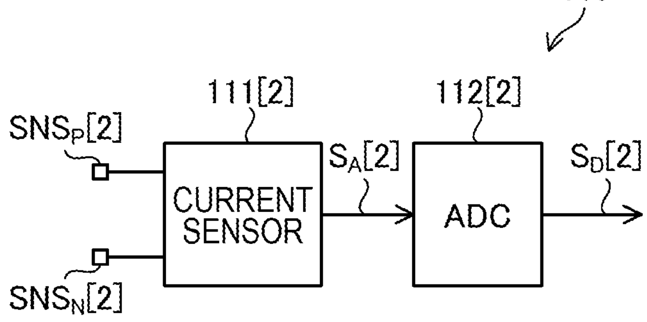
Figure 3:
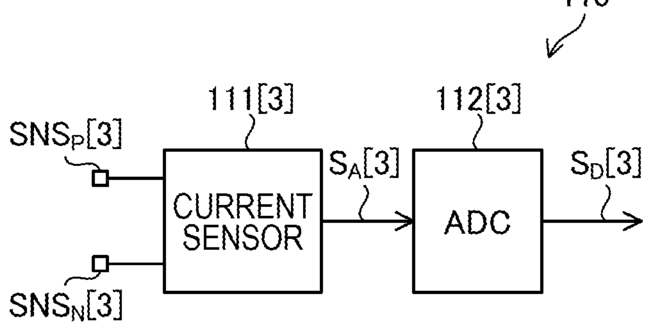

Specifically, the current sensing circuit 110 is composed of, for example as shown in FIG. 3, a current sensor 111[1] and an ADC 112[1] for the first phase, a current sensor 111[2] and an ADC 112[2] for the second phase, and a current sensor 111[3] and an ADC 112[3] for the third phase. The current sensor 111[i] is connected to the external terminals $SNS_P$[i] and $SNS_N$[i], and outputs an analog signal $S_A$[i] as an analog voltage signal with a voltage value proportional to the voltage (potential difference) between the external terminals $SNS_P$[i] and $SNS_N$[i]. The current sensor 111[i] can be configured with an amplification circuit including an operational amplifier. The ADC 112[i] is an analog-digital converter, and performs analog-digital conversion on the analog signal $S_A$[i] to generate a digital signal $S_D$[i]. The digital signal $S_D$[i] has a signal value proportional to the voltage (potential difference) between the external terminals $SNS_P$[i] and $SNS_N$[i], and the signal value of the digital signal $S_D$[i] corresponds to the detected current value VAL_IL[i]. In the configuration example in FIG. 3, three analog-digital converters (i.e., the ADC 112[1] to 112[3]) generate the digital signals $S_D$[1] to $S_D$[3]; instead, the current sensing circuit 110 may include only one analog-digital converter, and this analog-digital converter can be operated on a time-shared basis so that, from the analog signals $S_A$[1] to $S_A$[3], the one analog-digital converter generates the digital signals $S_D$[1] to $S_D$[3].

Based on the signal IL_DET and also a motor driving instruction signal fed from the host circuit 40, the control circuit 120 generates a driving control signal DRV for driving the three-phase motor 30 to rotate, and feeds the generated driving control signal DRV to the pre-driver circuit 130.

The pre-driver circuit 130 is connected to the external terminals $OUT_{MNT}$[1] to $OUT_{MNT}$[3], $P_{HG}$[1] to $P_{HG}$[3], $P_{LG}$[1] to $P_{LG}$[3], and $P_{GND}$. As mentioned above, the external terminals $OUT_{MNT}$[1] to $OUT_{MNT}$[3] are connected, respectively, across the external wirings $WR_O$[1] to $WR_O$[3] to one ends of the coils L[1] to L[3]. The external terminals $P_{HG}$[1] to $P_{HG}$[3] and $P_{LG}$[1] to $P_{LG}$[3] are connected, respectively, across other external wirings (not illustrated) to the gates of the transistors MH[1] to MH[3] and ML[1] to ML[3]. The pre-driver circuit 130, while referring to the voltages at the external terminal $OUT_{MNT}$[1] to $OUT_{MNT}$[3], generates the gate signals HG[1] to HG[3] and LG[1] to LG[3] based on the driving control signal DRV, and feeds the gate signals HG[1] to HG[3] and LG[1] to LG[3] to the gates of the transistors MH[1] to MH[3] and ML[1] to ML[3] respectively, thereby to turn on and off those transistors individually.

The gate signals HG[1] to HG[3] and LG[1] to LG[3] each take, as its signal level, either a high level or a low level. Note however that the potential of the high level, and also the potential of the low level, differs among the gate signals HG[i] and LG[i]. Turning the gate signal HG[i] to the high level turns the transistor MH[i] on, and turning the gate signal HG[i] to the low level turns the transistor MH[i] off. A similar description applies to the relationship between the gate signal LG[i] and the transistor ML[i]. Incidentally, a high-level gate signal HG[i] is generated using the supply voltage VCP.

Specifically, in response to the motor driving instruction signal from the host circuit 40, the control circuit 120 can perform vector control on the three-phase motor 30 based on the detected current values VAL_IL[1], VAL_IL[2] and VAL_IL[3] such that the three-phase motor 30 rotates at a rotation speed specified by the motor driving instruction signal or such that the three-phase motor 30 produces the torque specified by the motor driving instruction signal. The driving control signal DRV for achieving such vector control is fed to the pre-driver circuit 130 and thereby, for example, the three-phase motor 30 is driven with sinusoidal waves.

Figure 4:
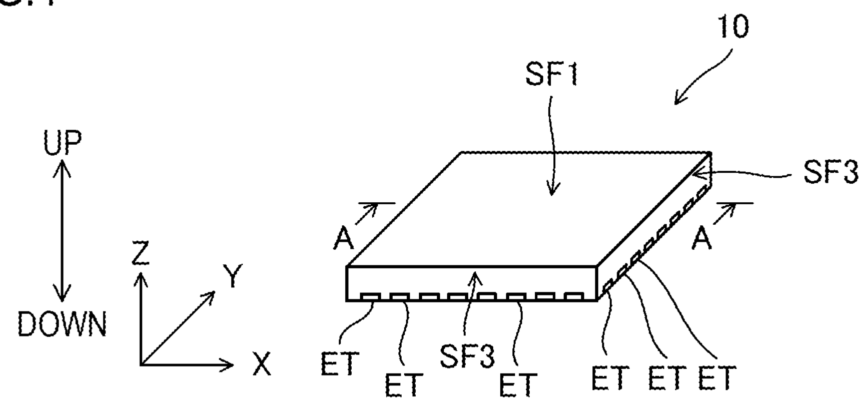
FIG. 4 is an exterior perspective view of a semiconductor device as seen from obliquely above in connection with the first embodiment of the present disclosure.

Referring to FIG. 4, the semiconductor device 10 has what is called a QFN (quad-flat no-leads) package. The semiconductor device 10 may have any type of package. In this embodiment, "package" denotes the package of the semiconductor device 10. In this embodiment, a three-dimensional rectangular coordinate system is assumed that expands along three mutually orthogonal X, Y, and Z axes, with the direction pointing from the negative to positive side along Z axis taken as the upward direction and the direction opposite to it as the downward direction. The plane parallel to X and Y axes is referred to as XY plane, the plane parallel to Y and Z axes is referred to as YZ plane, and the plane parallel to Z and X axes is referred to as ZX plane. The package has, as its exterior shape, the shape of a rectangular parallelepiped, and the rectangular parallelepiped as the exterior shape of the package has a top face SF1 and a bottom face SF2 parallel to XY plane and four side faces SF3. The top face SF1 and the bottom face SF2 are two faces that lie opposite each other, with the top face SF1 located on the positive side of the bottom face SF2 along Z axis. The four side faces SF3 consist of two side faces SF3 that are parallel to YZ plane and that lie opposite each other and two side faces SF3 that are parallel to ZX plane and that lie opposite each other.

Figure 5:
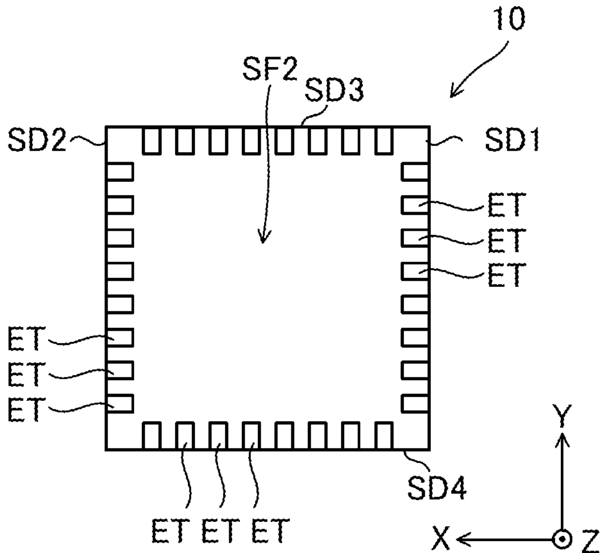
FIG. 5 is a plan view of a semiconductor device as seen from below in connection with the first embodiment of the present disclosure.
Figure 6:
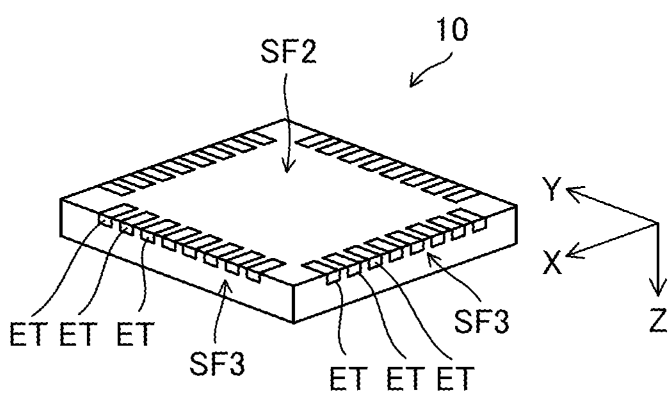
FIG. 6 is an exterior perspective view of a semiconductor device as seen from obliquely below in connection with the first embodiment of the present disclosure.

FIG. 4 is an exterior perspective view of the semiconductor device 10 as the top face SF1 and two side faces SF3 are viewed from the positive side along Z axis. FIG. 5 is a plan view of the semiconductor device 10 as the bottom face SF2 is viewed from the negative side along Z axis. FIG. 6 is an exterior perspective view of the semiconductor device 10 as the bottom face SF2 and two side faces SF3 are viewed from the negative side along Z axis. As viewed from a direction parallel to Z axis, the package has a rectangular exterior shape, and the four sides of this rectangular shape will be referred to as sides SD1 to SD4 (see FIG. 5). Sides SD1 and SD2 are two sides that lie opposite each other and are both parallel to Y axis. Sides SD3 and SD4 are two sides that lie opposite each other and are both parallel to X axis. In FIGS. 4 to 6, the symbol "ET" indicates an external terminal provided on the semiconductor device 10. Here, for the sake of concreteness, the semiconductor device 10 is assumed to have 32 external terminals ET. Note however that a semiconductor device 10 according to the present disclosure may have any number of external terminals ET. In FIGS. 4 to 6, to avoid complicated illustration, only part of the external terminals are indicated by the symbol "ET".

The total of 32 external terminals ET divide into a first external terminal row disposed along side SD1, a second external terminal row disposed along side SD2, a third external terminal row disposed along side SD3, and a fourth external terminal row disposed along side SD4, each external terminal row having eight external terminals ET. In each external terminal row, the external terminals ET are disposed at equal intervals. Each external terminal ET is a metal terminal exposed out of the package, and is exposed mainly on the bottom face SF2. Each external terminal ET in the first external terminal row is exposed out of the package on the bottom face SF2 to reach the side face SF3 corresponding to side SD1, and each external terminal ET in the second external terminal row is exposed out of the package on the bottom face SF2 to reach the side face SF3 corresponding to side SD2. A similar description applies to each external terminal ET in the third and fourth external terminal rows. Of the total of 32 external terminals ET, 26 external terminals ET are assigned to the following external terminals shown in FIG. 1: CP1, CP2, $P_{VCP}$, $P_{VM}$, $OUT_{IN}$[1] to $OUT_{IN}$[3], $OUT_{O}$[1] to $OUT_{O}$[3], $SNS_{P}$[1] to $SNS_{P}$[3], $SNS_{N}$[1] to $SNS_{N}$[3], $OUT_{MNT}$[1] to $OUT_{MNT}$[3], $P_{HG}$[1] to $P_{HG}$[3], $P_{LG}$[1] to $P_{LG}$[3], and $P_{GND}$. Any other assignment is possible.

Figure 7:
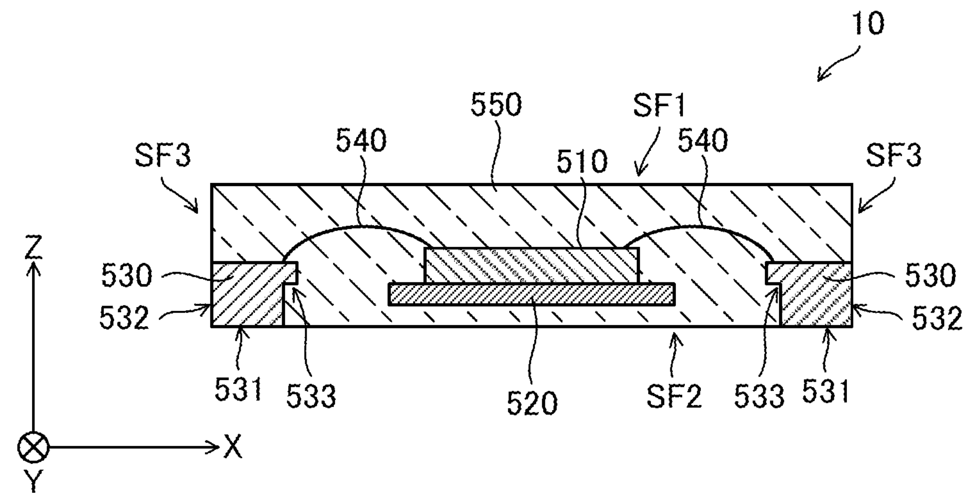
FIG. 7 is a sectional view of a semiconductor device according to the first embodiment of the present disclosure.

FIG. 7 is a sectional view of the semiconductor device 10 cut along section line A-A shown in FIG. 4 (i.e., a sectional view of the semiconductor device 10 cut on a sectional plane parallel to ZX plane). Note however that FIG. 7 is a schematic sectional view showing the positions relative to each other of the elements constituting the semiconductor device 10, and in practice the elements may have shapes different than illustrated there.

The semiconductor device 10 includes a semiconductor chip 510, a die pad 520 that supports the semiconductor chip 510, a plurality of leads 530, a plurality of chip-directed wires 540 for connecting (electrically connecting) between the semiconductor chip 510 and the plurality of leads 530, and a sealing resin 550. The wires 540 correspond to what is generally called bonding wires, but here, for clear distinction from the sense wires described later, are referred to as chip-directed wires.

The sealing resin 550 is an insulating material that seals all together the semiconductor chip 510, the die pad 520, the leads 530, and the chip-directed wires 540 as well as the sensing metal members described later (specifically, sense wires 560 and the like; not illustrated in FIG. 7). The sealing resin 550 constitutes the package of the semiconductor device 10. The package is so formed that part of each of the leads 530 is exposed out of the sealing resin 550. Specifically, each lead 530 is exposed over the whole or part of its bottom face 531 on the bottom face of the sealing resin 550 (hence the bottom face SF2 of the package), and each lead 530 is exposed over the whole or part of its side face 532 on a side face of the sealing resin 550 (hence a side face SF3 of the package).

The semiconductor chip 510 is a component in which a semiconductor integrated circuit is formed on a semiconductor substrate, and the semiconductor integrated circuit in the semiconductor chip 510 constitutes the various circuits within the semiconductor device 10, including the blocks 110, 120, 130, 140, 150, and 160. As will be described in detail later, the sense resistors $R_{SNS}$[1] to $R_{SNS}$[3] are formed outside the semiconductor chip 510. The semiconductor chip 510 is die-bonded on the die pad 520 with the face of the semiconductor chip 510 on which the functional elements are formed (i.e., the top face) pointing up. On the top face of the semiconductor chip 510, a plurality of pads (not illustrated) are formed by exposing parts of a wiring layer out of a surface protection layer. To each pad is connected the corresponding lead 530 via a chip-directed wire 540. That is, the semiconductor chip 510 and the plurality of lead 530 are connected together via the plurality of chip-directed wires 540. Needless to say, connection via a chip-directed wire 540, or by a chip-directed wire 540, is electrical connection.

The die pad 520 is formed of a thin metal sheet of which the thickness direction runs along Z axis. In the example in FIG. 7, the entire die pad 520 is sealed in the sealing resin 550; instead, the semiconductor device 10 may be configured such that the bottom face of the die pad 520 is exposed on the bottom face of the sealing resin 550 (hence the bottom face SF2 of the package). In that case, a stopper (not illustrated) is formed on the die pad 520 to prevent the die pad 520 from coming out of the sealing resin 550.

Figure 8:
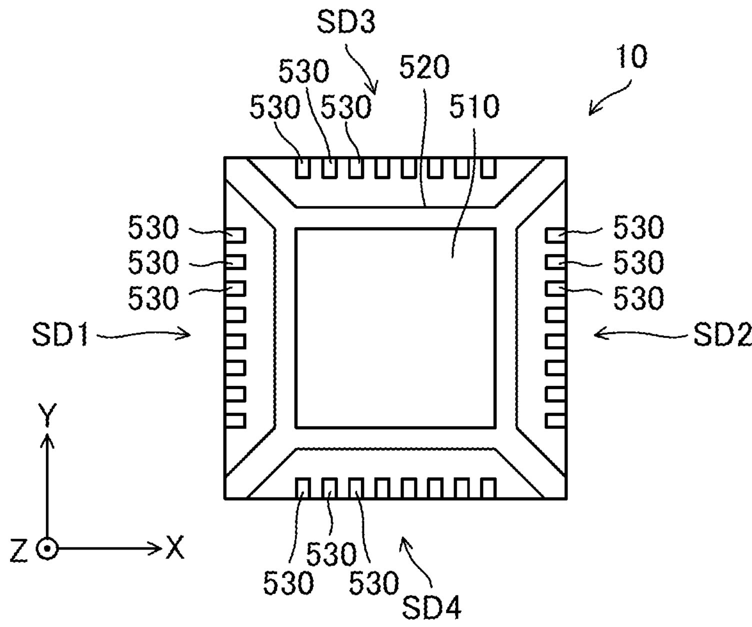
FIG. 8 is a transparent plan view of a semiconductor device according to the first embodiment of the present disclosure.

FIG. 8 is a see-through plan view, with the sealing resin 550 assumed to be transparent, of the semiconductor chip 510, the die pad 520, and the leads 530 (in reality, the sealing resin 550 is opaque). Note that the see-through plan view of FIG. 8 shows the semiconductor device 10 as viewed from the positive side along Z axis. In FIG. 8, the elements other than the semiconductor chip 510, the die pad 520, and the leads 530 are omitted from illustration. The outermost square in FIG. 8 represents the outline of the package. In FIG. 8, to avoid complicated illustration, only part of the leads 530 are indicated by the reference sign "530".

Figure 9:
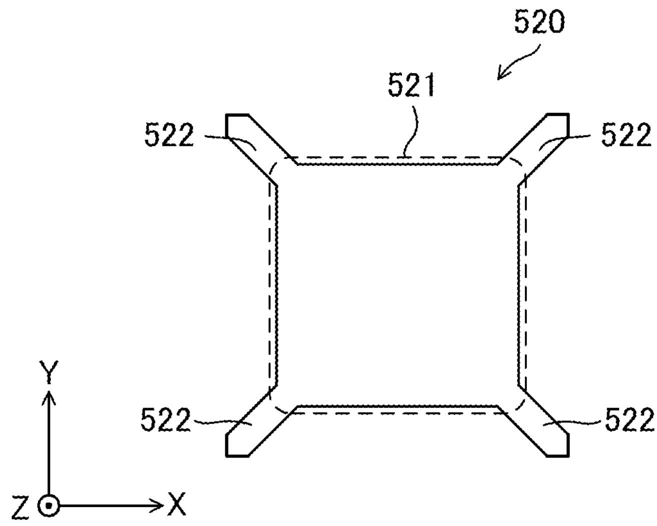
FIG. 9 is a plan view of a die pad according to the first embodiment of the present disclosure.

The semiconductor chip 510 and the die pad 520 each have a generally rectangular shape as seen in a plan view. Note however that, as shown in FIG. 9, the die pad 520 has, in addition to a main part 521 in a rectangular shape as seen in a plan view, a total of four suspension leads 522 extending from the corners of the rectangular shape to the corresponding corners of the package. As seen in a plan view, the rectangular shape of the die pad 520 is larger than the rectangular shape of the semiconductor chip 510, and the entire semiconductor chip 510 lies on the top face of the die pad 520. In this embodiment, seeing an object in a plan view means seeing the object from above along Z axis.

With respect to the center of the semiconductor chip 510 or the center of the die pad 520, eight of the leads 530 are provided on the positive side along X axis, another eight are provided on the negative side along X axis, another eight are provided on the positive side along Y axis, and the other eight are provided on the negative side along Y axis. That is, the total of 32 leads 530 are disposed in a manner distributed around the semiconductor chip 510 and hence the die pad 520. The total of 32 leads 530 divide into a first lead row disposed along side SD1, a second lead row disposed along side SD2, a third lead row disposed along side SD3, and a fourth lead row disposed along side SD4, each lead row having eight leads 530. In each lead row, the eight leads 530 are disposed at equal intervals.

Each lead 530 is composed of a metal part embedded in the package and a metal part exposed out of the package, with the former metal part referred to as an inner lead and the latter metal part as an outer lead. In each lead 530, the outer lead functions as the corresponding metal terminal ET. Depending on the type of package, outer leads protrude out of the package as pin-form metal terminals ET. The eight lead 530 forming the first lead row constitute the eight external terminals ET forming the first external terminal row, and the eight lead 530 forming the second lead row constitute the eight external terminals ET forming the second external terminal row. A similar description applies to the third and fourth lead rows.

Each lead 530 is configured as a thin metal sheet of which the thickness direction runs along Z axis. While in FIG. 8 each lead 530 has a generally rectangular shape as seen in a plan view, it may have any other shape as seen in a plan view. The leads 530 are made of copper. The leads 530 may be made of any metal other than copper. For example, the leads 530 may be formed of what is called 42-alloy (an alloy of iron with nickel). The die pad 520 can be formed of the same material as the leads 530. Each lead 530 has a stopper 533 formed on it to prevent the lead 530 from coming out of the package (see FIG. 7). Though not expressly illustrated in FIGS. 7 and 8, each lead 530 has a solder-wettable metal-plated layer formed on its exposed part.

The chip-directed wires 540 are metal wires formed of gold, aluminum, or copper. Of each chip-directed wire 540, one end is connected to a given pad on the semiconductor chip 510 and the other end is connected to a given position on a given lead 530 so that the given pad and the given lead 530 are electrically connected together via the chip-directed wire 540. The connection point between the lead 530 and the chip-directed wire 540 (i.e., the point at which the chip-directed wire 540 is wire-bonded to the lead 530) lies on an inner lead.

The total of 32 leads 530 may all be connected via the chip-directed wires 540 to the semiconductor chip 510, or the total of 32 leads 530 may not all be connected to the semiconductor chip 510. That is, the semiconductor device 10 may haven leads 530 forming n external terminals ET along with m chip-directed wires 540, and may be configured such that m leads 530 among the n leads 530 are connected via m chip-directed wires 540 to the semiconductor chip 510. In the example of this embodiment, n=32 but n may be any value other than 32. On the other hand, m is any integer of n or less but two or more. As will be described later, no chip-directed wires 540 need be connected to the leads 530 constituting the external terminals $OUT_{IN}$[i] and $OUT_{O}$[i].

The first embodiment includes Practical Examples EX1_1 to EX1_6 described below. Each practical example deals with a distinctive configuration with respect to the sense resistors $R_{SNS}$[1] to $R_{SNS}$[3] in FIG. 1. Unless otherwise stated or unless inconsistent, any features described above in connection with the first embodiment are applicable to Practical Examples EX1_1 to EX1_6 described below. For any feature of any practical example that contradicts what has been described above in connection with the first embodiment, the description of that feature given in connection with that practical example can prevail. Among Practical Examples EX1_1 to EX1_6, unless inconsistent, any feature described in connection with one practical example is applicable to any other practical example (i.e., any two or more of the practical examples may be combined together).

Practical Example EX1_1

Figure 10A:
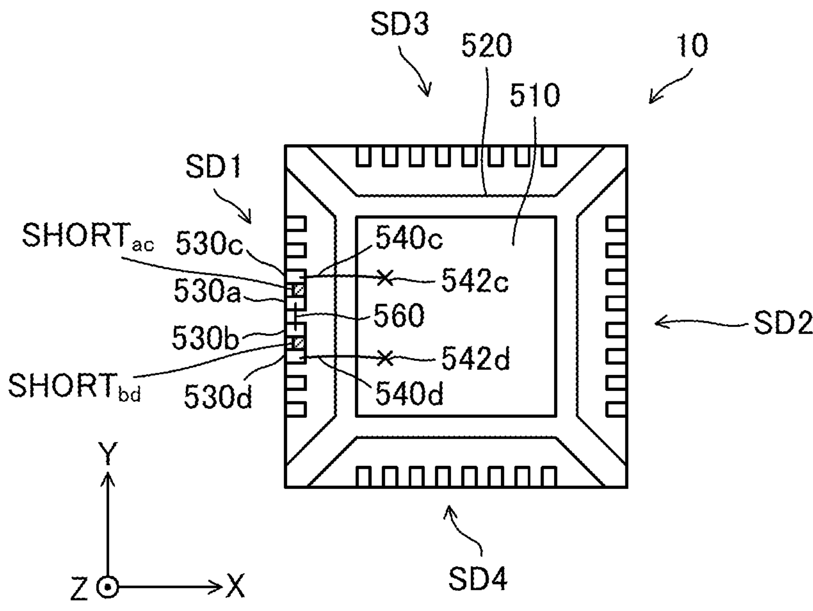
FIG. 10A is a transparent plan view of a semiconductor device in connection with Practical Example EX1_1 belonging to the first embodiment of the present disclosure (with one sense wire).
Figure 10B:
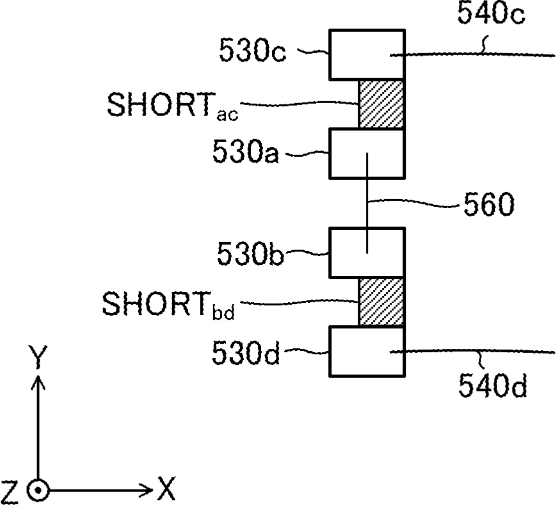
FIG. 10B is a transparent plan view of a semiconductor device in connection with Practical Example EX1_1 belonging to the first embodiment of the present disclosure (with one sense wire).
Figure 11:
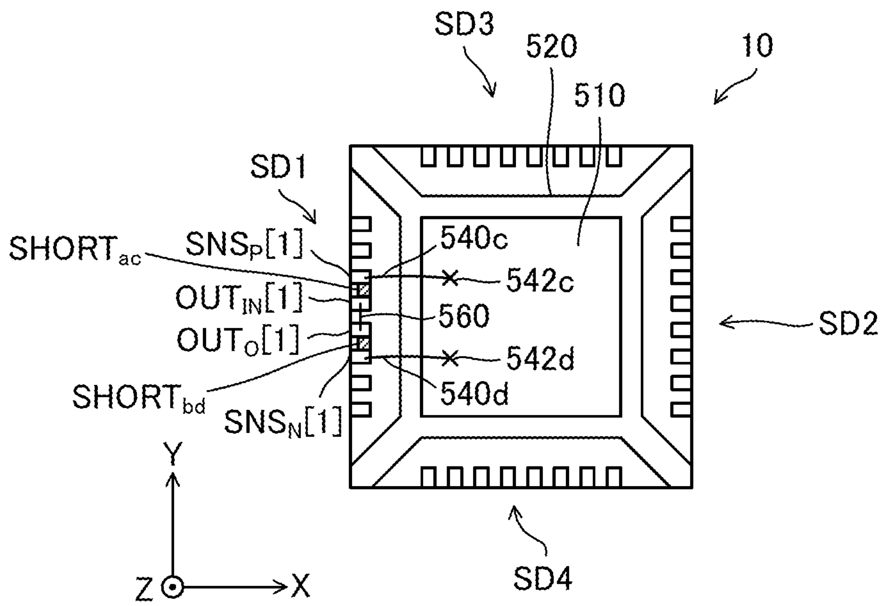
FIG. 11 is a transparent plan view of a semiconductor device in connection with Practical Example EX1_1 belonging to the first embodiment of the present disclosure (with focus on external terminals).

Practical Example EX1_1 will be described. FIG. 10A is a see-through plan view of the semiconductor device 10 with the sealing resin 550 assumed to be transparent. The see-through plan view of FIG. 10A shows the semiconductor device 10 as viewed from the positive side along Z axis. FIG. 10A shows only those parts which are relevant to the description of the technology involved in Practical Example EX1_1, with some of the elements constituting the semiconductor device 10 omitted from illustration (the same applies to FIGS. 11, 13, and 14 referred to later). In FIG. 10A, the outermost square represents the outline of the package (the same applies to FIGS. 11, 13, 14, 25, and 27 referred to later). Moreover, in FIG. 10A, of the plurality of leads 530, four particular leads are identified by the reference signs "530*a*", "530*b*", "530*c*", and "530*d*" (the same applies to FIGS. 13 and 14 referred to later). The chip-directed wire 540 connecting between the lead 530*c* and the semiconductor chip 510 is identified specifically by the reference sign "540*c*", and the chip-directed wire 540 connecting between the lead 530*d* and the semiconductor chip 510 is identified specifically by the reference sign "540*d*". FIG. 10B is an enlarged view of part of FIG. 10A. Of what is shown in FIGS. 10A and 10B, the parts $SHORT_{ac}$ and $SHORT_{bd}$ indicated as hatched regions will be described later and first, with those parts $SHORT_{ac}$ and $SHORT_{bd}$ ignored, the structure of the rest will be described.

The leads 530*a* to 530*d* are four mutually adjacent leads 530 provided along the side SD1, and are arranged in the order 530*d*, 530*b*, 530*a*, and 530*c* from the negative to positive side along Y axis. That is, the leads 530*a* and 530*b* are adjacent to each other, with the leads 530*a* located between the leads 530*b* and 530*c* and with the leads 530*b* located between the leads 530*a* and 530*d*. Here, the leads 530*a* to 530*d* are assumed to be four leads 530 assigned to the first phase. Then, as will be understood from a comparison between FIGS. 10A and 11, the leads 530*a*, 530*b*, 530*c*, 530*d* are assigned the external terminals $OUT_{IN}$[1], $OUT_{O}$[1], $SNS_{P}$[1], and $SNS_{N}$[1] respectively. That is, the lead 530*a* constitutes the external terminal $OUT_{IN}$[1], the lead 530*b* constitutes the external terminal $OUT_{O}$[1], the lead 530*c* constitutes the external terminal $SNS_{P}$[1], and the lead 530*d* constitutes the external terminal $SNS_{N}$[1].

In the semiconductor device 10 shown in FIG. 10A, the leads 530*a* and 530*b* are connected together by a sense wire 560 within the package. The sense wire 560 is an example of a sensing metal member that connects between the leads 530*a* and 530*b*. The sense wire 560 is a metal wire formed of gold, aluminum, or copper. The sense wire 560 may be formed of the same material as a chip-directed wire 540, and the sense wire 560 may have the same thickness (i.e., diameter on a cross-section) as a chip-directed wire 540.

Figure 12:
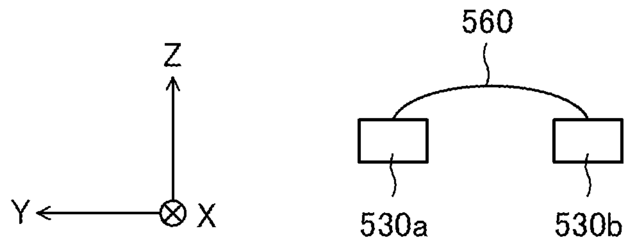
FIG. 12 is a diagram showing the relationship of a sense wire with two leads in connection with Practical Example EX1_1 belonging to the first embodiment of the present disclosure.

FIG. 12 is a side view of the leads 530*a* and 530*b* and the sense wire 560 as viewed along X axis. One end of the sense wire 560 is connected to a predetermined position on the top face of the lead 530*a* (hence a predetermined position on the inner lead of the lead 530*a*) and the other end of the sense wire 560 is connected to a predetermined position on the top face of the lead 530*b* (hence a predetermined position on the inner lead of the lead 530*b*). A sense wire and a lead are connected together by well-known wire-bonding as are a chip-directed wire and a lead. The sense wire 560 connects between the leads 530*a* and 530*b* across the shortest path or a close-to-shortest path. The sense wire 560 is not connected at least to the semiconductor chip 510; it thus connects between the leads 530*a* and 530*b* without passing via the semiconductor chip 510. Needless to say, connection via a sense wire 560, or by a sense wire 560, is electrical connection.

Figure 13:
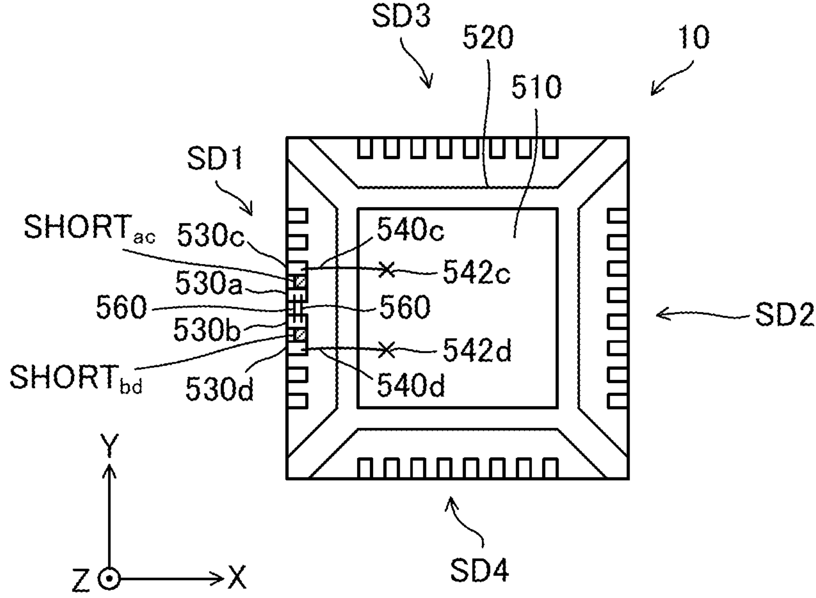
FIG. 13 is a transparent plan view of a semiconductor device in connection with Practical Example EX1_1 belonging to the first embodiment of the present disclosure (with two sense wires).
Figure 14:
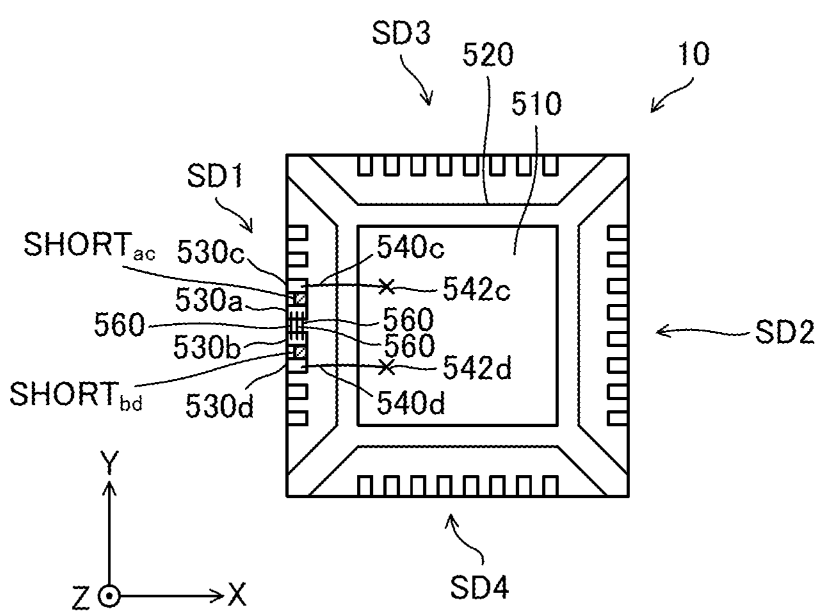
FIG. 14 is a transparent plan view of a semiconductor device in connection with Practical Example EX1_1 belonging to the first embodiment of the present disclosure (with three sense wires).

The leads 530a and 530b may be connected together by one sense wire 560, or any number, two or more, of sense wires 560. Specifically, for example, the leads 530a and 530b may be connected together by two sense wires 560 as shown in FIG. 13, or the leads 530a and 530b may be connected together by three sense wires 560 as shown in FIG. 14. In a case where the leads 530a and 530b are connected together by a plurality of sense wires 560, the sense wires 560 may have equal lengths. Instead, the plurality of wires 560 may have mutually different lengths, or p sense wires 560 may have q different lengths (where p is an integer of three or more, and q is an integer of two or more but less than p).

In the following description of Practical Example EX1_1, it is assumed that the leads 530a and 530b are connected together by $N_A$ sense wires 560. Here, $N_A$ is any integer of one or more. The $N_A$ sense wires 560 constitute the sense resistor $R_{SNS}$[1] in FIG. 1. That is, if "$N_A$=1", the resistance value of the sense wire 560 itself counts as the resistance value of the sense resistor $R_{SNS}$[1]; if "$N_A$≥2", the parallel resistance value of the $N_A$ sense wires 560 counts as the resistance value of the sense resistor $R_{SNS}$[1]. While in strict terms the resistive components of the leads 530a and 530b themselves should be included in the sense resistor $R_{SNS}$[1], the resistance values of those leads are negligibly low as compared with the resistance value of the sense wires 560 (and will be ignored in the following description).

Figure 15:
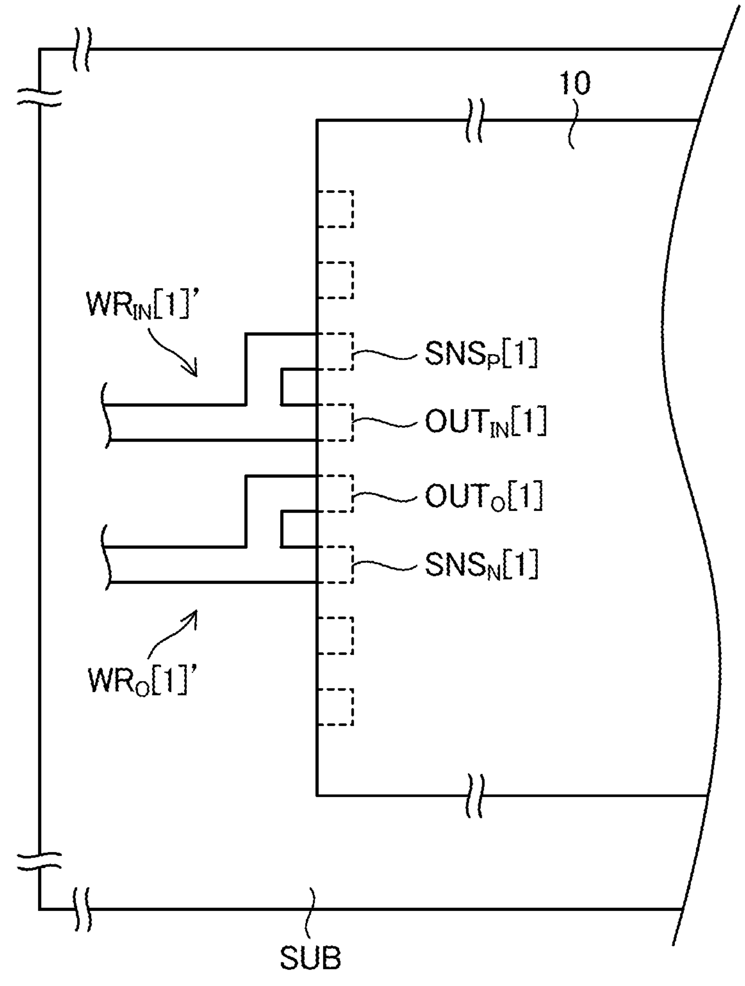
FIG. 15 is a diagram showing the relationship of external terminals of a semiconductor device with wiring patterns on a circuit board in connection with Practical Example EX1_1 belonging to the first embodiment of the present disclosure.

FIG. 15 is a schematic plan view of part of a circuit board SUB with the semiconductor device 10 mounted on it. A plurality of lands having solder applied to them are formed on the circuit board SUB at wherever they are needed (in FIG. 15, the lands are not illustrated). The semiconductor device 10 is placed at a position where its external terminals (the bottom faces of the leads) face the surfaces of the lands on the circuit board SUB and, with the external terminals (the bottom faces of the leads) in contact with the solder on the lands, reflow is performed, so that the semiconductor device 10 is mounted on the circuit board SUB. On the circuit board SUB, as part of the external wires $WR_{IN}$[1] shown in FIG. 1, a wiring pattern $WR_{IN}$[1]' is formed, and in addition, as part of the external wire $WR_O$[1] shown in FIG. 1, a wiring pattern $WR_O$[1]' is formed. The land connected to the external terminal $OUT_{IN}$[1] and the land connected to the external terminal $SNS_P$[1] are short-circuited together by the wiring pattern $WR_{IN}$[1]' on the circuit board SUB, and thereby the external terminal $OUT_{IN}$ [1] (hence the lead 530a) is short-circuited via the external wire $WR_{IN}$[1]' to the external terminal $SNS_P$[1] (hence the lead 530c). Likewise, the land connected to the external terminal $OUT_O$[1] and the land connected to the external terminal $SNS_N$[1] are short-circuited together by the wiring pattern $WR_O$[1]' on the circuit board SUB, and thereby the external terminal $OUT_O$[1] (hence the lead 530b) is short-circuited via the external wire $WR_O$[1]' to the external terminal $SNS_N$[1] (hence the lead 530d).

Referring back to FIG. 10A, the connection point 542c between the semiconductor chip 510 and the chip-directed wire 540c and the connection point 542d between the semiconductor chip 510 and the chip-directed wire 540d are connected to the current sensing circuit 110 (see FIG. 1) formed on the semiconductor chip 510. The connection points 542c and 542d are points at which the chip-directed wires 540c and 540d, respectively, are wire-bonded to the semiconductor chip 510. Across the sense resistor $R_{SNS}$[1] (here, $N_A$ sense wires 560) occurs a voltage drop proportional to the coil current IL[1], and between the connection points 542c and 542d appears a potential difference commensurate with the voltage drop. Thus the current sensing circuit 110 can, based on the potential difference between the connection points 542c and 542d, sense the coil current IL[1] and acquire the detected current value VAL_IL[1] mentioned above. The potential difference between the connection points 542c and 542d can be safely regarded as equal to the potential difference between the external terminals $SNS_P$[1] and $SNS_N$[1].

Incidentally, there are no chip-directed wires 540 that connect either of the external terminals $OUT_{IN}$[1] and $OUT_O$[1] to the semiconductor chip 510. That is, no chip-directed wires are connected to either of the external terminals $OUT_{IN}$[1] and $OUT_O$[1]. The external terminal $OUT_{IN}$ [1] and the semiconductor chip 510, or the external terminal $OUT_O$[1] and the semiconductor chip 510, may be connected together by a particular chip-directed wire 540; in that case, that particular chip-directed wire 540 is not connected to any significant circuit on the semiconductor chip 510, and does not affect in any way the operation of the semiconductor device 10 described with reference to FIG. 1.

In the example shown in FIG. 10A, of the eight leads 530 disposed along side SD1, the four leads 530 around the middle are allotted as leads 530a to 530d. Instead, of the eight leads 530 disposed along side SD1, any leads may be allotted as leads 530a to 530d. It is however preferable that the leads 530a to 530d be disposed in the order 530d, 530b, 530a, and 530c as mentioned above. Here, the lead 530d or 530c may be, of the eight leads 530 disposed along side SD1, the lead 530 at an end.

While the structure involved in the sensing of a coil current has been described with focus on the first phase, the structure involved in the sensing of a coil current in the second phase and the structure involved in the sensing of a coil current in the third phase are similar to that for the first phase, and thus the technology described with respect to the first phase is applied to the second and third phases as well. With focus on the second phase, the suffix "[1]" in the above description of Practical Example EX1_1 can be read as "[2]" and then the leads 530a to 530d can be taken as, for example, four leads 530 disposed along side SD3. Likewise, with focus on the third phase, the suffix "[1]" in the above description of Practical Example EX1_1 can be read as "[3]" and then the leads 530a to 530d can be taken as, for example, four leads 530 disposed along side SD4.

More specifically, one possible configuration is as follows. The semiconductor device 10 can include three sets of leads 530a to 530d, with the first set of leads 530a to 530d assigned to the external terminal $OUT_{IN}$[1], $OUT_O$[1], $SNS_P$ [1], and $SNS_N$[1], the second sets of leads 530a to 530d assigned to the external terminal $OUT_{IN}$[2], $OUT_O$[2], $SNS_P$ [2], and $SNS_N$[2], and the third set of leads 530a to 530d assigned to the external terminal $OUT_{IN}$[3], $OUT_O$[3], $SNS_P$ [3], and $SNS_N$[3]. The first set of leads 530a to 530d, the second sets of leads 530a to 530d, and the third set of leads 530a to 530d are typically disposed along mutually different sides of the semiconductor device 10. Of these 12 leads in total, two or more belonging to different sets may be disposed along the same side.

The current sensing circuit 110 can, based on the potential difference between the leads 530c and 530d in the first set (the potential difference between the connection point 542c and 542d with respect to the first set), sense the coil current IL[1] and acquire the detected current value VAL_IL[1] mentioned above; based on the potential difference between the leads 530c and 530d in the second set (the potential difference between the connection point 542c and 542d with respect to the second set), sense the coil current IL[2] and acquire the detected current value VAL_IL[2] mentioned above; and, based on the potential difference between the leads 530_c_ and 530_d_ in the third set (the potential difference between the connection point 542_c_ and 542_d_ with respect to the third set), sense the coil current IL[3] and acquire the detected current value VAL_IL[3] mentioned above.

One numerical example is as follows. Consider a case where, along side SD1, SD2, SD3, or SD4, the center-to-center distance between two adjacent leads 530 is 500 μm (micrometers). It is assumed that a sense wire 560 has a circular cross-sectional shape, has a diameter of 30 μm in its cross-section, and is formed of copper. In this case, using a sense wire 560 with a length of 500 μm gives one sense wire 560 a resistance value (end-to-end resistance value) of about 12.5 mΩ. The parallel resistance value of two sense wires 560 is then about 6.25 mΩ, and the parallel resistance value of three sense wires 560 about 4.16 mΩ.

Consider sine-wave driving in which the three-phase motor 30 is supplied with a sine-wave current of 14 A (amperes) in terms of effective value as the coil current IL[i] of each phase. In this sine-wave driving, if two sense wires 560 are used as the sense resistor $R_{SNS}$[i] of each phase (i.e., if $N_A$=2), since 14 A×6.25 mΩ=87.5 mV, a sine-wave voltage drop of 87.5 mV in terms of effective value occurs across the sense resistor $R_{SNS}$[i] of each phase. It is thus possible to detect the coil current IL[i] with accuracy high enough to allow vector control.

Here, the power consumption in the sense resistor $R_{SNS}$[i] of each phase is given as 14 A×14 A×6.25 mΩ≈1.23, that is, about 1.23 W, and thus the total power consumption in the sense resistors $R_{SNS}$[1] to $R_{SNS}$[3] is about 3.7 W. This roughly falls within the permissible power consumption (the maximum power permitted to be consumed within a package, also called package power) of common 5 mm or so square QFN packages. The number of sense wires 560 (i.e., the value of $N_A$) or the diameter of sense wires 560 can be adjusted with consideration given to the balance between the accuracy required in the sensing of the coil current IL[i] and the package power.

In a common motor driving system taken here as a first imaginary configuration, to enable sensing of a coil current (in particular, a comparatively high coil current, like 10 A or higher), a sense resistor (with a resistance value of about 10 mΩ) is externally connected to a semiconductor device. Here, the resistance value of the sense resistor externally connected to the semiconductor device is prone to individual variation, and variation of the resistance value of the sense resistor degrades the accuracy of current sensing and hence makes it difficult to achieve desired motor control (e.g., vector control). With this in mind, as described above, within the package of the semiconductor device 10, the sense resistor $R_{SNS}$[i], which corresponds to the sense resistor mentioned above, is formed of a sensing metal member (here, one or more sense wires 560) that connects leads together. This makes it possible to measure the resistance value of the sensing metal member (here, one or more sense wires 560) in the pre-shipment inspection procedure of the semiconductor device 10, and it is thereafter possible to sense the coil current IL[i] accurately by evaluating the potential difference between the external terminal $SNS_P$[i] and $SNS_N$[i] using calibration information based on the measurement results (a technology related to calibration information will be described in detail in connection with another practical example described later). Advantageously, this eliminates the need to prepare a sense resistor as an externally connected component.

Moreover, as described above, by adjusting the number of sense wires 560 (i.e., the value of $N_A$) for each phase, it is possible to adjust the resistance value of the sense resistor $R_{SNS}$[i], and by alternatively or additionally adjusting the diameter of sense wires 560, it is possible to adjust the resistance value of the sense resistor $R_{SNS}$[i]. Through adjustment of those parameters, it is possible to secure the accuracy needed in the sensing of the coil current IL[i] while giving consideration to the package power.

A second imaginary configuration will now be studied. In the second imaginary configuration, the lead 530_a_ and the semiconductor chip 510 are connected together by a first chip-directed wire, the lead 530_b_ and the semiconductor chip 510 are connected together by a second chip-directed wire, and the connection point between the semiconductor chip 510 and the first chip-directed wire and the connection point between the semiconductor chip 510 and the second chip-directed wire are connected together on the semiconductor chip 510. Then, in the second imaginary configuration, the series resistance of the first and second chip-directed wires constitutes the sense resistor $R_{SNS}$[i]. Note however that, in the second imaginary configuration, as compared with the configuration shown in FIG. 10A etc., the wires that constitute the sense resistor $R_{SNS}$[i] are longer (e.g., several times), resulting in too high power consumption in the wires. Moreover, the heat generated in the wires may have a greater effect on the semiconductor integrated circuit.

Incidentally, a lead-to-lead short-circuiting technology is applied to the semiconductor device 10 of Practical Example EX1_1. The lead-to-lead short-circuiting technology employed in Practical Example EX1_1 permits the leads 530_a_ and 530_c_ to be short-circuited together, and permits the leads 530_b_ and 530_d_ to be short-circuited together, each pair within the package without passing via the semiconductor chip 510. More specifically, with the lead-to-lead short-circuiting technology applied to it, the semiconductor device 10 of Practical Example EX1_1 includes, as shown in FIGS. 10A, 10B, etc., a short-circuiting metal member $SHORT_{ac}$ for short-circuiting the leads 530_a_ and 530_c_ together within the package without passing via the semiconductor chip 510 and a short-circuiting metal member $SHORT_{bd}$ for short-circuiting the leads 530_b_ and 530_d_ together within the package without passing via the semiconductor chip 510. In FIGS. 10A, 10B, etc., for convenience' sake, those short-circuiting metal members are each indicated by a hatched area.

The short-circuiting metal member $SHORT_{ac}$ is a metal member that integrally couples together the leads 530_a_ and 530_c_. The short-circuiting metal member $SHORT_{ac}$ is formed of the same material as the leads 530_a_ and 530_c_. In FIGS. 10A, 10B, etc., for convenience' sake, not only the short-circuiting metal member $SHORT_{ac}$ is indicated by a hatched area, boundaries are illustrated as if to be present between the leads 530_a_ and 530_c_ and the short-circuiting metal member $SHORT_{ac}$; in practice, the lead 530_a_, the short-circuiting metal member $SHORT_{ac}$, and the lead 530_c_ can be formed of a single piece of metal sheet without any such boundaries. It can be understood that such a single piece of metal sheet forms a single lead, and this single lead forms the leads 530_a_ and 530_c_. The dimension (thickness) of the short-circuiting metal member $SHORT_{ac}$ in the Z-axis direction may be equal to the dimension (thickness) of the leads 530_a_ and 530_c_ (in particular, in their respective metal parts 530_p4) in the Z-axis direction.

A similar description applies to the short-circuiting metal member $SHORT_{bd}$. Specifically, the short-circuiting metal member $SHORT_{bd}$ is a metal member that integrally couples together the leads 530*b* and 530*d*. The short-circuiting metal member $SHORT_{bd}$ is formed of the same material as the leads 530*b* and 530*d*. In FIGS. 10A, 10B, etc., for convenience' sake, not only the short-circuiting metal member $SHORT_{bd}$ is indicated by a hatched area, boundaries are illustrated as if to be present between the leads 530*b* and 530*d* and the short-circuiting metal member $SHORT_{bd}$; in practice, the lead 530*b*, the short-circuiting metal member $SHORT_{bd}$, and the lead 530*d* can be formed of a single piece of metal sheet without any such boundaries. It can be understood that such a single piece of metal sheet forms a single lead, and this single lead forms the leads 530*b* and 530*d*. The dimension (thickness) of the short-circuiting metal member $SHORT_{bd}$ in the Z-axis direction may be equal to the dimension (thickness) of the leads 530*b* and 530*d* (in particular, in their respective metal parts 530_*p*4) in the Z-axis direction.

The dimension (thickness) of the short-circuiting metal members $SHORT_{ac}$ and $SHORT_{bd}$ in the Z-axis direction is significantly larger (e.g., 200 μm) than the diameter (e.g., 30 μm) of each sense wire 560, and also the dimension (width) of the short-circuiting metal members $SHORT_{ac}$ and $SHORT_{bd}$ in the X-axis direction is significantly larger than the diameter of each sense wire 560. Accordingly, with respect to the array direction of the leads 530*a* to 530*d* (i.e., the Y-axis direction), the resistance value per unit length of each of the short-circuiting metal members $SHORT_{ac}$ and $SHORT_{bd}$ is significantly lower (negligibly low) than the resistance value per unit length of the sense resistor $R_{SNS}$[i] composed of $N_A$ sense wires 560. As mentioned above, $N_A$ represents any integer of one or more. Moreover, with respect to the array direction of the leads 530*a* to 530*d*, the dimension of each of the short-circuiting metal members $SHORT_{ac}$ and $SHORT_{bd}$ is smaller than the dimension of each sense wire 560. Accordingly, the resistance value (e.g., about 10 μΩ) of each of the short-circuiting metal members $SHORT_{ac}$ and $SHORT_{bd}$ is significantly lower than the resistance value (e.g., about 5 mΩ) of the sense resistor $R_{SNS}$[i] composed of $N_A$ sense wires 560. The significance of the provision of the short-circuiting metal members $SHORT_{ac}$ and $SHORT_{bd}$ will become clear through the description, given later, of a test procedure.

Practical Example EX1_2

Figure 16:
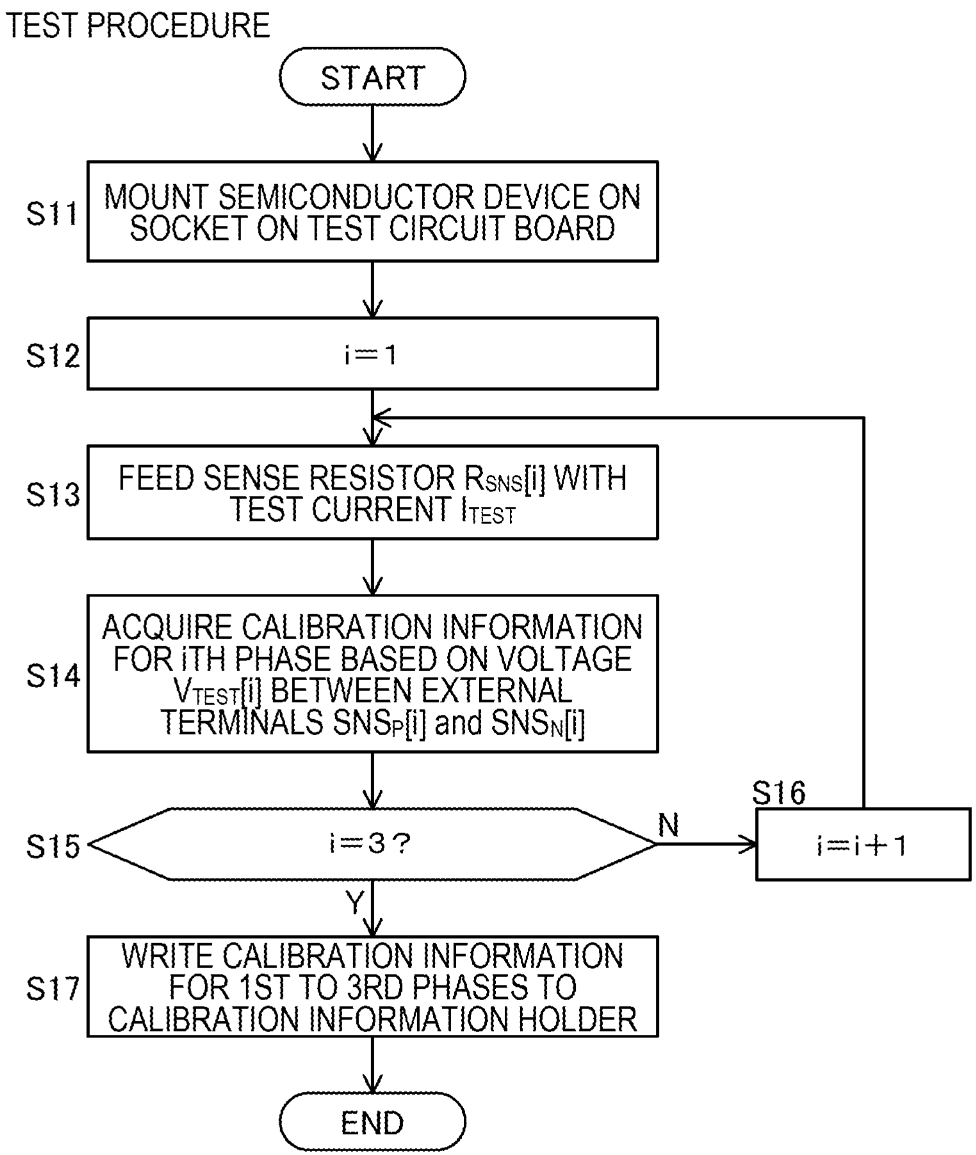
FIG. 16 is a flow chart of a test procedure in connection with Practical Example EX1_2 belonging to the first embodiment of the present disclosure.

Practical Example EX1_2 will be described. Practical Example EX1_2 deals with a method for accurate sensing of a coil current by use of calibration information. FIG. 16 is a flow chart of a test procedure for acquiring and recording calibration information. The test procedure is built into, as part of, a pre-shipment inspection procedure of the semiconductor device 10.

Figure 17:
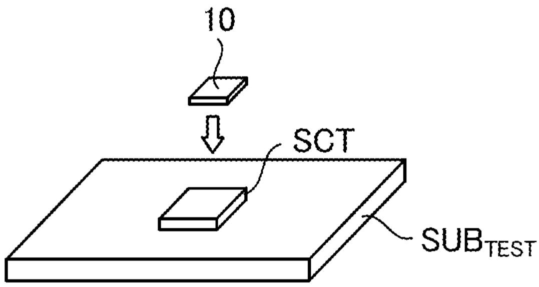
FIG. 17 is a diagram showing the relationship among a test circuit board, a socket, and a semiconductor device in a test procedure in connection with Practical Example EX1_2 belonging to the first embodiment of the present disclosure.

In the test procedure, a test circuit board $SUB_{TSET}$ as shown in FIG. 17 is prepared separately from the circuit board in FIG. 2, and the semiconductor device 10 is kept in a testing state. The test circuit board $SUB_{TSET}$ is fitted with a socket SCT for mounting the semiconductor device 10 on. In the testing state, the semiconductor device 10 is mounted on the socket SCT. With the semiconductor device 10 mounted on the socket SCT, the external terminals of the semiconductor device 10 conduct to the corresponding wiring patterns on the test circuit board $SUB_{TSET}$ via the socket SCT (in FIG. 17, the wiring patterns are omitted from illustration). Wiring patterns equivalent to the wiring patterns $WR_{IN}$[i]' and $WR_O$[i]' (see FIG. 15; note however that, in FIG. 15, i=1) are formed on the test circuit board $SUB_{TSET}$ and, in the testing state, via the wiring patterns on the test circuit board $SUB_{TSET}$, the external terminals $OUT_{IN}$[i] and $SNS_P$[i] are short-circuited together and also the external terminals $OUT_O$[i] and $SNS_N$[i] are short-circuited together. Moreover, the test circuit board $SUB_{TSET}$ is configured so that in the testing state it can supply the sense resistor $R_{SNS}$[i] of each phase in the semiconductor device 10 with the necessary current.

In the test procedure, first, at step S11, the semiconductor device 10 is mounted on the socket SCT on the test circuit board $SUB_{TSET}$; subsequently, at step S12, "1" is substituted in the variable i, and an advance is made to step S13. At step S13, in the testing state, the sense resistor $R_{SNS}$[i] is supplied with a predetermined test current $I_{TSET}$ (i.e., a test current $I_{TSET}$ is passed between the external terminals $OUT_{IN}$[i] and $OUT_O$[i]). It is assumed that the test current $I_{TSET}$ is a direct current (e.g., 10 A) that flows from the external terminal $OUT_{IN}$[i] to the external terminal $OUT_O$[i]

Subsequently to step S13, at step S14, a test circuit (not illustrated) within the semiconductor device 10 senses, as a voltage $V_{TEST}$[i], the voltage between the external terminals $SNS_P$[i] and $SNS_N$[i] as observed while the sense resistor $R_{SNS}$[i] is being supplied with the test current $I_{TSET}$ and, based on the voltage $V_{TEST}$[i], acquires calibration information for the ith phase. The test circuit is a circuit formed on the semiconductor chip 510, and functions significantly only in the testing state. The acquisition of calibration information for the ith phase may be achieved by coordination of the test circuit with a circuit on the test circuit board $SUB_{TSET}$.

Subsequently to step S14, at step S15, the test circuit mentioned above checks whether i=3. If i=3, then an advance is made to step S17; if not, then at step S16, the variable i is incremented by "1", and a return is made to step S13, so that steps S13 and S14 are repeated. Thus, when step S17 is reached, calibration information for the first to third phases has been acquired. At step S17, the calibration information for the first to third phases is written to the calibration data holder 160 in FIG. 1, and then the test procedure in FIG. 16 is ended. The writing of the calibration information is achieved by the test circuit, or by coordination of the test circuit with a circuit on the test circuit board $SUB_{TSET}$.

The calibration data holder 160 holds in a non-volatile manner the calibration information for the first to third phases written to it at step S17. The calibration data holder 160 is configured with a non-volatile memory (e.g., an OTPROM [one-time programmable read-only memory]). Instead, the calibration information for each phase may be held in a non-volatile manner by any well-known technique, such as Zener zapping, polysilicon fusing, or laser cutting. Note that, in the test procedure in FIG. 16, steps S13 and S14 with i=1, steps S13 and S14 with i=2, and steps S13 and S14 with i=3 may be performed concurrently.

The calibration information for the ith phase is information that is previously set according to the resistance value (actual resistance value) of the sense resistor $R_{SNS}$[i]. This will now be elaborated on.

Let the design value of the resistance value of the sense resistor $R_{SNS}$[i] be $R_{IDEAL}$[i]. Then, if the actual resistance value is as designed, when steps S13 and S14 are reached, a voltage corresponding to $I_{TEST} \times R_{IDEAL}$[i] (e.g., 10 A×10 mΩ=100 mV) should appear between the external terminals $SNS_P$[i] and $SNS_N$[i]. The actually sensed voltage $V_{TEST}$[i], however, can often deviate from $I_{TEST} \times R_{IDEAL}$[i] (e.g., $V_{TEST}$[i]=80 mV). Let the actual resistance value of the sense resistor $R_{SNS}$[i] (hereinafter referred to as the actual resistance value) be $R_{REAL}$[i], then $V_{TEST}[i]=I_{TEST} \times R_{REAL}$

[i]. Since, in the test procedure, the value of the test current $I_{TEST}$ is known, the actual resistance value $R_{REAL}$[i] is known from the voltage $V_{TEST}$[i] (e.g., $R_{REAL}$[i]=$V_{TEST}$[i]/$I_{TEST}$=80 mV/10 A=8 mΩ). At step S14 in FIG. 16, the calibration information for the ith phase is acquired based on the actual resistance value $R_{REAL}$[i].

Having gone through the pre-shipment inspection procedure including the test procedure, the semiconductor device 10 is mounted on the circuit board SUB as shown in FIG. 2 and is built into the motor driving system SYS. The state of the semiconductor device 10 built in the motor driving system SYS will occasionally be referred to as, for clear distinction from the testing state mentioned above, an operating state. This embodiment assumes that the semiconductor device 10 is in the operating state except when the test procedure is discussed. A description will now be given of a method of sensing coil currents by use of calibration information in the operating state. How the coil currents IL[1] to IL[3] are sensed by use of calibration information is common to the first to third phases; accordingly, using the variable i, the following description will deal with how the coil current IL[i] is sensed for the ith phase.

The calibration information for the ith phase may be the actual resistance value $R_{REAL}$[i] itself. In that case, in the operating state the current sensing circuit 110 in FIG. 1 can, by dividing the voltage between the external terminals $SNS_P$[i] and $SNS_N$[i] by the actual resistance value $R_{REAL}$[i], acquire the detected current value VAL_IL[i] of the coil current IL[i].

In practical terms, for example, the calibration information for the ith phase can be calibration information for the ADC 112[i] in FIG. 3. In that case, the ADC 112[i] can be configured such that, in the operating state, $S_D$[i]=$k_{REF}$×$k_C$[i]×$S_A$[i] (note that $S_D$[i] contains a quantization error). Specifically, the ADC 112[i] can be configured such that, in the operating state, the value of the digital signal $S_D$[i], which represents the detected current value VAL_IL[i], equals the product of a predetermined fixed reference coefficient $k_{REF}$ (which may be one, i.e., $k_{REF}$=1), a correction coefficient $k_C$[i], and the value of the analog signal $S_A$[i]. Here, the correction coefficient $k_C$[i] serves as the calibration information for the ith phase such that $k_C$[i]=$R_{IDEAL}$[i]/$R_{REAL}$[i]. For example, if ($R_{IDEAL}$[i],$R_{REAL}$[i])=(10 mΩ, 8 mΩ), then $k_C$[i]=1.25; this eliminates the error in the detected current value VAL_IL[i] in the operating state resulting from the actual resistance value $R_{REAL}$[i] being lower than the design value $R_{IDEAL}$[i].

As described above, in the current sensing circuit 110, for each phase, the coil current IL[i] is sensed based on the calibration information for the ith phase as previously set according to the actual resistance value of the sense resistor $R_{SNS}$[i] and the voltage between the external terminals $SNS_P$[i] and $SNS_N$[i] (corresponding to the potential difference between the connection points 542*c* and 542*d* for the ith phase; see FIG. 10A). It is thus possible to sense the coil current IL[i] accurately.

The current sensing circuit 110 may further include a temperature sensing circuit (not illustrated) for sensing the temperatures of the sense resistors $R_{SNS}$[1] to $R_{SNS}$[3]. The temperature sensing circuit senses the temperatures at a first to a third temperature sensing locations within the package, and outputs a first temperature sense signal commensurate with the temperature at the first temperature sensing location, a second temperature sense signal commensurate with the temperature at the second temperature sensing location, and a third temperature sense signal commensurate with the temperature at the third temperature sensing location. The current sensing circuit 110 may then, by referring to the ith temperature sense signal, sense the coil current IL[i] of each phase. It is thus possible to sense the coil current IL[i] more accurately with consideration given to the temperature dependence of the resistance value of the sense resistor $R_{SNS}$[i].

The first to third temperature sensing locations may be three mutually different locations. In that case, the ith temperature sensing location can be a location close to where the sense resistor $R_{SNS}$[i] is disposed. Variations among the temperatures of the sense resistors $R_{SNS}$[1] to $R_{SNS}$[3] can often be safely ignored, in which case temperature can be sensed at one location. When temperature is sensed at one location, a single, common temperature sensing location is understood to serve as the first to third temperature sensing locations and a single, common temperature sensing signal is understood to serve as the first to third temperature sensing signals.

Since the temperature coefficient of the sense resistor $R_{SNS}$[i] (e.g., the temperature coefficient of the sense wire 560) is known, the current sensing circuit 110 can correct the detected current value VAL_IL[i] based on the ith temperature sense signal and the temperature coefficient of the sense resistor $R_{SNS}$[i]. Specifically, for example, the ADC 112[i] in FIG. 3 can be configured such that, in the operating state, $S_D$[i]=$k_{REF}$×$k_C$[i]×$k_{TC}$[i]×$S_A$[i] (note however that $S_D$[i] contains a quantization error). Here, $k_{TC}$[i] is a correction coefficient commensurate with the temperature at the ith temperature sensing location. Suppose that, while in the test procedure the temperature at the ith temperature sensing location as identified based on the first temperature sense signal is $T_{REF}$[i], in the operating state the temperature at the ith temperature sensing location as identified from the ith temperature sense signal is $T_{REAL}$[i] and the temperature coefficient of the sense resistor $R_{SNS}$[i] (e.g., the temperature coefficient of the sense wire 560) is $k_R$[i], a setting can be made such that $k_{TC}$[i]=1/(1+($T_{REAL}$[i]−$T_{REF}$[i])·$k_R$[i]).

Practical Example EX1_3

Figure 18:
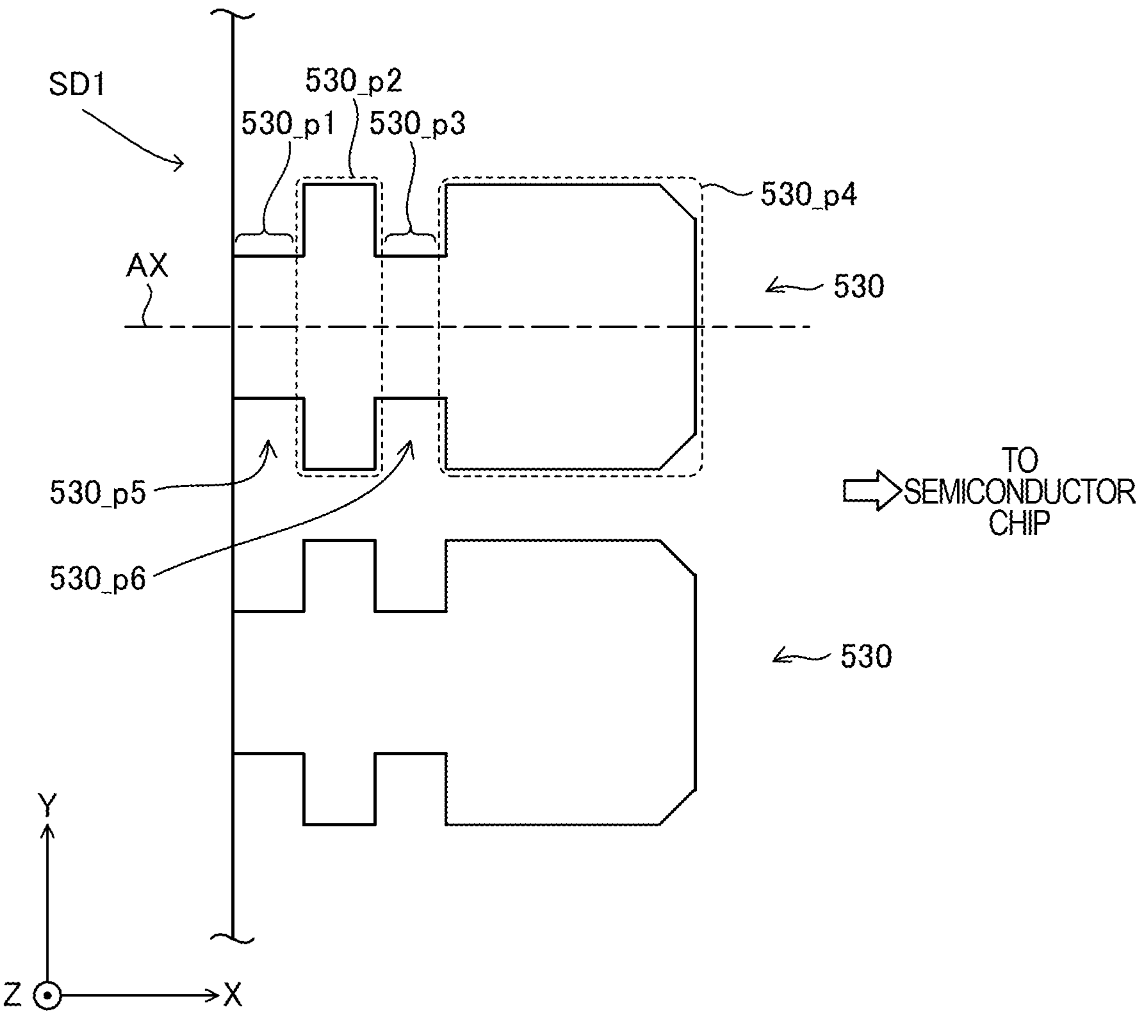
FIG. 18 is a plan view of leads in connection with Practical EX1_3 belonging to the first embodiment of the present disclosure.

Practical Example EX1_3 will be described. While the leads 530 may be given any specific shape, Practical Example EX1_3 deals with one specific example of the shape of leads 530. FIG. 18 is a plan view of leads 530 according to Practical Example EX1_3. In FIG. 18, for simplicity's sake, only two leads 530 provided along side SD1 are illustrated as representatives (the same applies to FIGS. 19 and 20 referred to later). The two leads 530 shown in FIG. 18 can constitute the external terminals $OUT_{IN}$[i] and $OUT_O$[i]. In this case, the lead-to-lead short-circuiting technology described above is applied such that one lead 530 shown in FIG. 18 is integrally coupled to another lead 530 not illustrated in FIG. 18 and the other lead 530 shown in FIG. 18 is integrally coupled to yet another lead 530 not illustrated in FIG. 18, though such coupling is omitted from illustration in FIG. 18 (the same applies to FIGS. 19 and 20 referred to later). While the shape of leads 530 will be described below with focus on one lead 530, any other lead 530 has a similar shape.

The lead 530 is a metal member composed of metal parts 530_*p*1 to 530_*p*4 formed integrally. From the side (in FIG. 18, side SD1) along which the leads 530 are provided toward the semiconductor chip 510 (hence toward the die pad 520), the metal parts 530_*p*1, 530_*p*2, 530_*p*3, and 530_*p*4 are disposed in this order. As seen in a plan view, the metal parts 530_*p*1, 530_*p*2, 530_*p*3, and 530_*p*4 are each in a generally rectangular shape. It should however be noted that the metal part 530_p4 has its corner parts near the semiconductor chip 510 and the die pad 520 cut off.

In FIG. 18, a dash-dot-line AX represents the center axis of the lead 530 that runs along the array direction of the metal parts 530_p1 to 530_p4. With respect to the plane on which center axis AX lies and that is parallel to Z axis, the lead 530 has a plane-symmetrical structure. With respect to the direction orthogonal to both Z axis and center axis AX, the dimension of the metal part 530_p2 is greater than the dimension of each of the metal parts 530_p1 and 530_p3, and the dimension of the metal part 530_p4 is greater than the dimension of each of the metal parts 530_p1 and 530_p3. Accordingly, in the lead 530, on both sides of the metal part 530_p2 in the array direction of the metal parts 530_p1 to 530_p4, indentations 530_p5 and 530_p6 are formed, with the sealing resin 550 filling the indentations 530_p5 and 530_p6 (in the sealing process, the sealing resin 550 enters them). Thus, even if the lead 530 is acted on by an external force that tends to move it away from the semiconductor chip 510 and the die pad 520, the lead 530 does not come out of the package. The indentations 530_p5 and 530_p6 can be understood to form a stopper.

Figure 19:
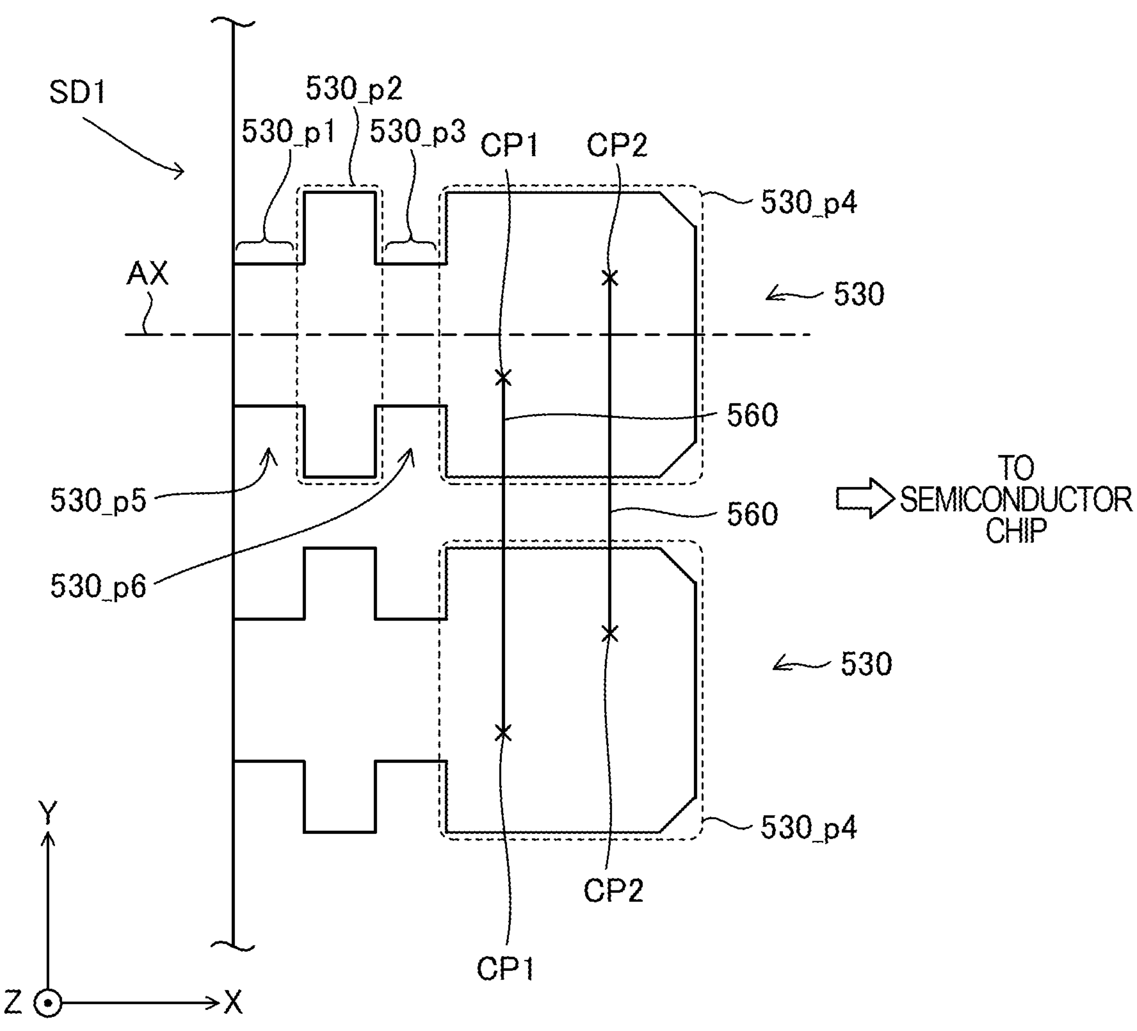
FIG. 19 is a diagram showing two leads connected tougher by two sense wires in connection with Practical Example EX1_3 belonging to the first embodiment of the present disclosure.

In a case where a first and a second lead 530 constitute the external terminals $OUT_{IN}$[i] and $OUT_{O}$[i], as shown in FIG. 19, regardless of the number of sense wires 560, one and the other ends of any sense wire 560 that connects between the first and second leads 530 are connected (wire-bonded) respectively to the metal part 530_p4 of the first lead 530 and the metal part 530_p4 of the second lead 530. In a case where the first and second leads 530 are connected together by a plurality of sense wires 560 (in FIG. 19, two of them), it is preferable that the plurality of sense wires 560 be given equal lengths (though they may be given different lengths as mentioned earlier). The plurality of sense wires 560 are disposed at a distance from each other. No problem is posed, though, by contact among the plurality of sense wires 560 within the package.

For example, in a case where the first and second leads 530 are connected together by two sense wires 560, two mutually different connection points CP1 and CP2 are defined on the metal part 530_p4 of each of the leads 530. One and the other ends of one sense wire 560 can be connected (wire-bonded) respectively to the connection point CP1 on the first lead 530 and the connection point CP1 on the second lead 530, and one and the other ends of the other sense wire 560 can be connected (wire-bonded) respectively to the connection point CP2 on the first lead 530 and the connection point CP2 on the second lead 530. The position at which the connection point CP1 is defined on the metal part 530_p4 is common to the plurality of leads 530, and the position at which the connection point CP2 is defined on the metal part 530_p4 is common to the plurality of leads 530. This gives the two sense wires 560 equal lengths. With respect to the metal part 530_p4 of each of the first and second leads 530, the positions of the connection points CP1 and CP2 are displaced from each other in the array direction of the metal parts 530_p1 to 530_p4 (in FIG. 19, in the X-axis direction), and are displaced from each other also in the array direction of the first and second leads 530 (in FIG. 19, in the Y-axis direction).

Figure 20:
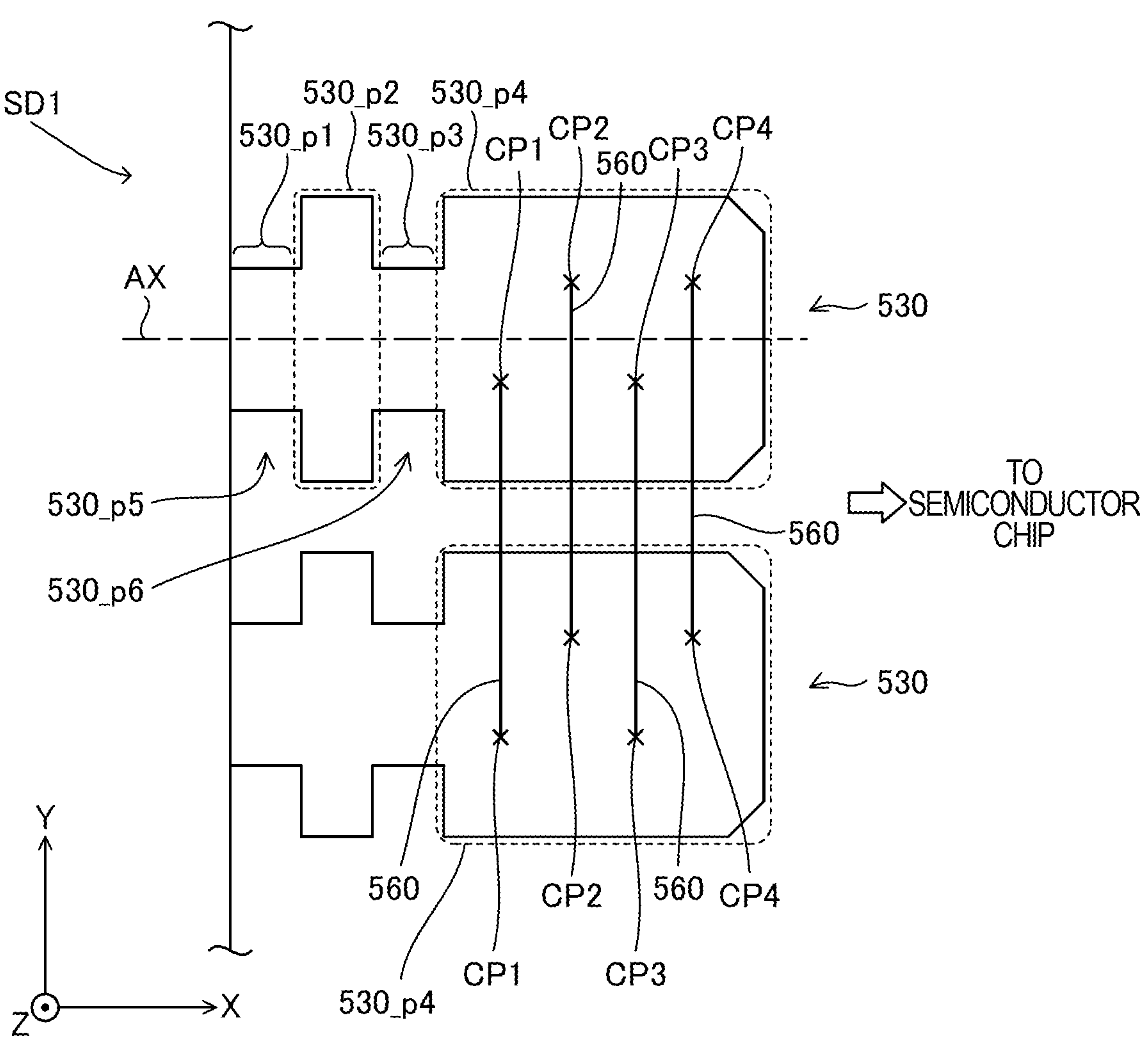
FIG. 20 is a diagram showing two leads connected tougher by four sense wires in connection with Practical Example EX1_3 belonging to the first embodiment of the present disclosure.

In a case where the first and second leads 530 are connected together by a plurality of sense wires 560, as necessary, the metal part 530_p4 of each of the first and second leads 530 may be extended toward the semiconductor chip 510 (hence toward the die pad 520). FIG. 20 is a plan view of the first and second leads 530 so extended. In FIG. 20, the first and second leads 530 are connected together by a first to a fourth sense wire 560. With respect to the array direction of the metal parts 530_p1 to 530_p4 (in FIG. 20, the X-axis direction), the first to fourth sense wires 560 are disposed in this order at a distance from each other. The first to fourth sense wires 560 are given equal lengths. As mentioned earlier, however, the first to fourth sense wires 560 may have a plurality of mixed lengths; for example, the first and third sense wires 560 may be given a first length, and the second and fourth sense wires 560 may be given a second length (where the first and second lengths differ from each other). The first to fourth sense wires 560 are disposed at a distance from each other.

A description will now be given of a configuration where the first to fourth sense wires 560 are given equal lengths. First, mutually different connection points CP1 to CP4 are defined on the metal part 530_p4 of each of the leads 530. Then one and the other ends of the jth sense wire 560 are connected (wire-bonded) respectively to the connection point CPj on the first lead 530 and the connection point CPj on the second lead 530. This is fulfilled under each of the conditions j=1, j=2, j=3, and j=4.

The position at which the connection point CPj is defined on the metal part 530_p4 is common to the plurality of leads 530. This is fulfilled under each of the conditions j=1, j=2, j=3, and j=4. On the metal part 530_p4 of each of the first and second leads 530, the positions of the connection points CP1 to CP4 are displaced from each other in the array direction of the metal parts 530_p1 to 530_p4 (in FIG. 20, in the X-axis direction). Instead, on the metal part 530_p4 of each of the first and second leads 530, the positions of the connection points CP1 and CP3 may coincide in the array direction of the first and second leads 530 (in FIG. 20, the Y-axis direction), and the positions of the connection points CP2 and CP4 may coincide in the array direction of the first and second leads 530 (in FIG. 20, the Y-axis direction). On the metal part 530_0 of each of the first and second leads 530, the positions of the connection points CP1 and CP3 are displaced from the positions of the connection points CP2 and CP4 in the array direction of the first and second leads 530 (in FIG. 20, the Y-axis direction).

Extending the metal part 530_p4 here means extending it compared with the standard, predefined shape of leads. The extension of the metal part 530_p4 may be applied to all leads 530; or the extension of the metal part 530_0 may be applied only to those leads 530 to which sense wires 560 are connected. In that case, the dimension in the center axis AX direction of the metal part 530_p4 of the leads 530 to which sense wires 560 are connected (i.e., the lead 530 that constitutes the external terminal $OUT_{IN}$[i] or $OUT_{OUT}$[i]) is larger than the dimension in the center axis AX direction of the metal part 530_p4 of the other leads 530 (e.g., the lead 530 that constitutes the external terminal $SNS_{P}$[i] or $SNS_{N}$[i] or the lead 530 that constitutes the external terminal $P_{GND}$). The extension of the metal part 530_p4 may be applied on a side by side basis. For example, among all sides SD1 to SD4, the above-mentioned extension may be applied to the leads 530 provided along side SD1 but not to the leads 530 provided along side SD2. In that case, the dimension in the center axis AX direction of the metal part 530_p4 of the leads 530 provided along side SD1 is larger than the dimension in the center axis AX direction of the metal part 530_p4 of the leads 530 provided along side SD2.

Practical Example EX1_4

Figure 21:
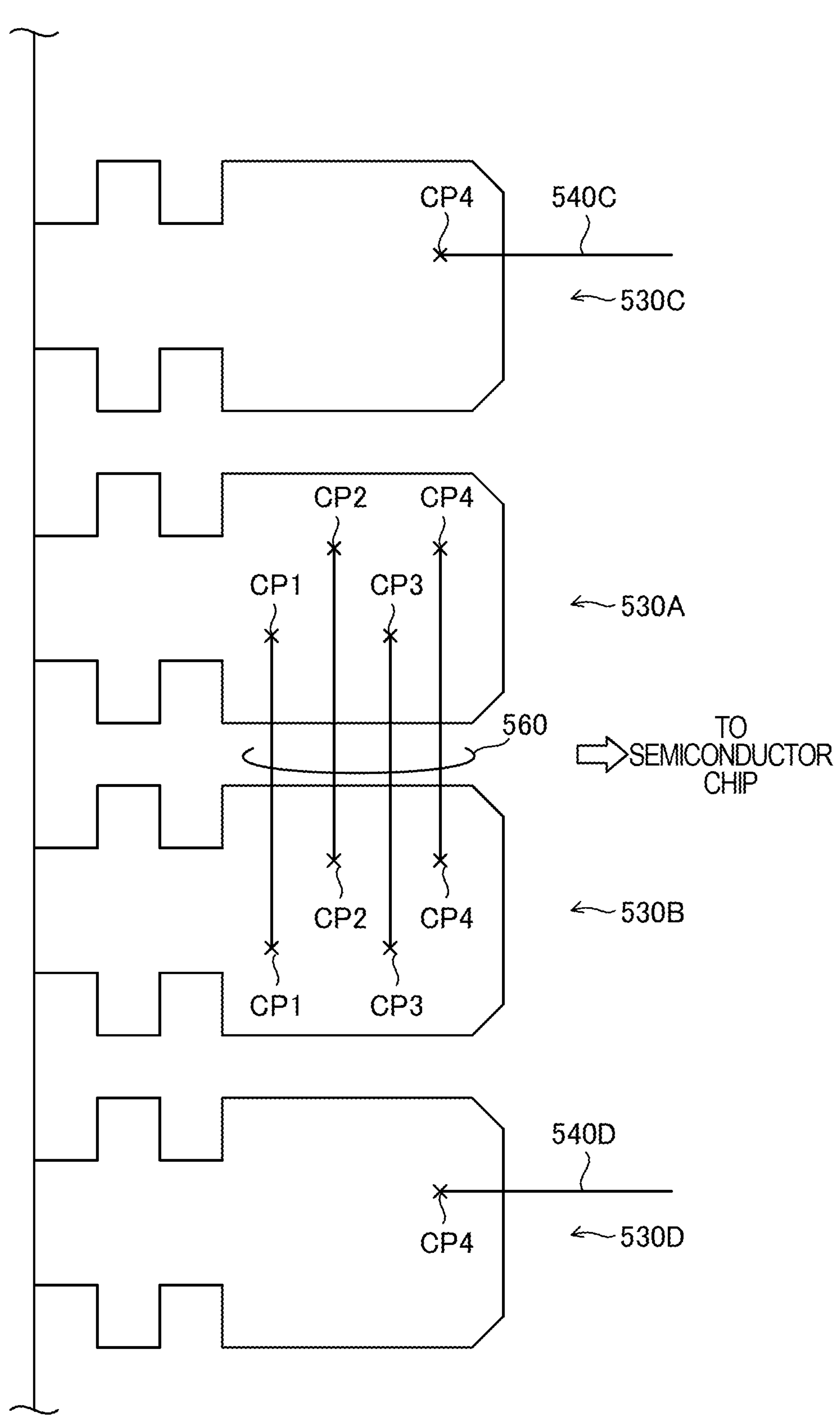
FIG. 21 is a plan view of and around a plurality of leads involved in current sensing, for contrasting with the first embodiment.
Figure 22:
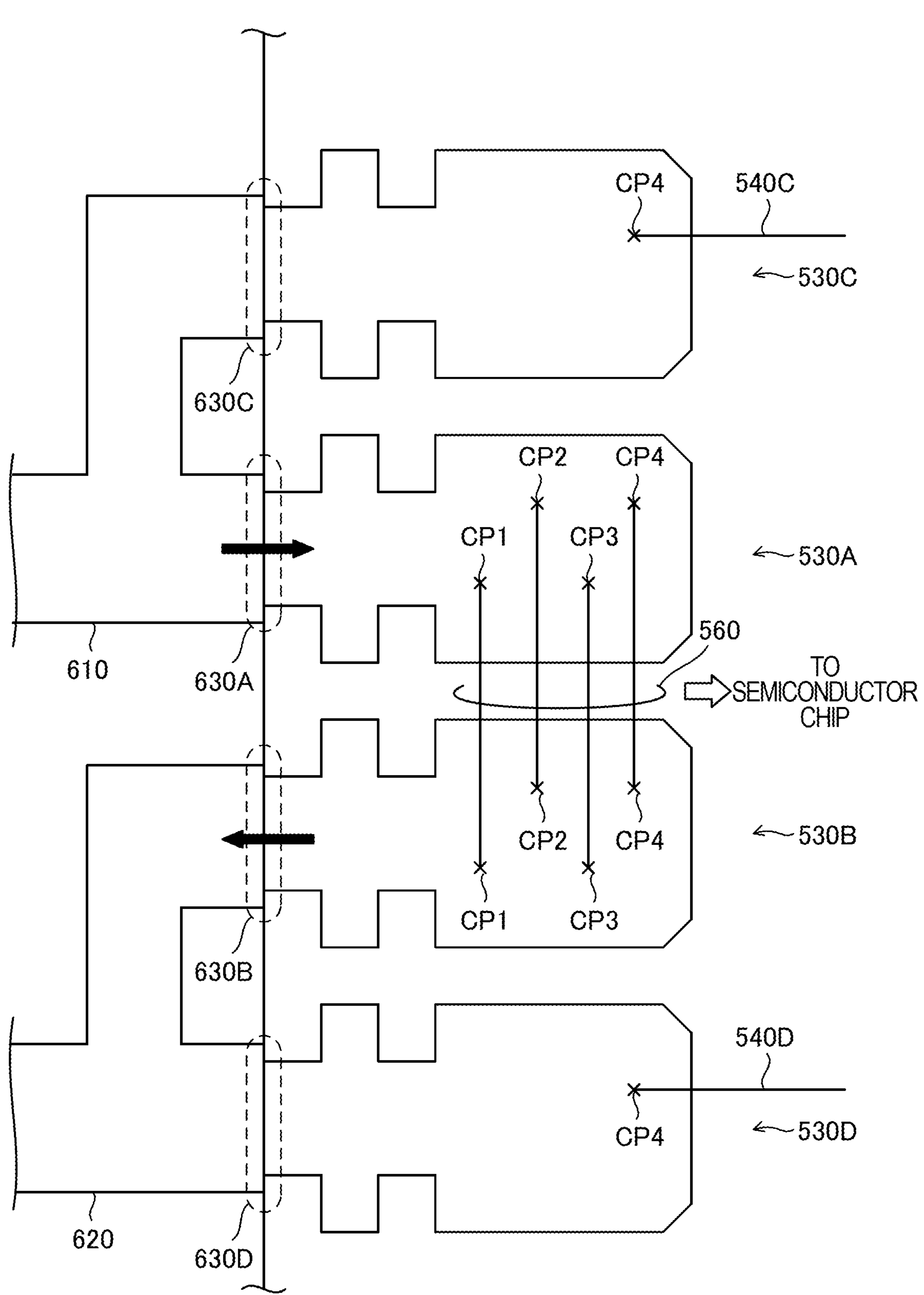
FIG. 22 is a plan view of and around a plurality of leads involved in current sensing, showing the flows of currents, for contrasting with the first embodiment.

Practical Example EX1_4 will be described. Practical Example EX1_4 assumes that each lead 530 has a shape as described in connection with Practical Example EX1_3, and pays attention to the four leads 530A to 530D shown in FIGS. 21 and 22. The configuration shown in FIGS. 21 and 22 is a configuration according to the second embodiment described later, and is to be contrasted with the configuration according to the first embodiment to which a lead-to-lead short-circuiting technology is applied. The leads 530A, 530B, 530C, and 540D correspond to the leads 530*a*, 530*b*, 530*c*, and 540*d* shown in FIG. 10A. That is, the leads 530A, 530B, 530C, and 530D are leads 530 for constituting the external terminals $OUT_{IN}$[i], $OUT_O$[i], $SNS_P$[i], and $SNS_N$[i] respectively. Along the side at which the leads 530A to 530D are provided (i.e., along one of sides SD1 to SD4), the leads 530C, 530A, 530B, and 530D are disposed in this order, adjacent to each other. In the manner described with reference to FIG. 20, the lead 530A as the first lead 530 and the lead 530B as the second lead 530 are connected together by four sense wires 560. In FIG. 21, the reference sign "540C" identifies the chip-directed wire that connects together the lead 530C and the semiconductor chip 510, and the reference sign "540D" identifies the chip-directed wire that connects together the lead 530D and the semiconductor chip 510. One end of the chip-directed wire 540C is connected (wire-bonded) to the connection point CP4 on the lead 530C, and one end of the chip-directed wire 540D is connected (wire-bonded) to the connection point CP4 on the lead 530D.

FIG. 22 is a conceptual diagram of a state around the leads 530A to 530D in the testing state mentioned above in connection with the second embodiment. The wiring patterns formed on the test circuit board $SUB_{TSET}$ (see FIG. 17) include wiring patterns 610 and 620. In the testing state, the external terminal $OUT_{IN}$[i], which functions as the outer lead of the lead 530A, is connected via a first terminal 630A in the socket SCT to a part of the wiring pattern 61; the external terminal $OUT_O$[i], which functions as the outer lead of the lead 530B, is connected via a second terminal 630B in the socket SCT to a part of the wiring pattern 620; the external terminal $SNS_P$[i], which functions as the outer lead of the lead 530C, is connected via a third terminal 630C in the socket SCT to another part of the wiring pattern 610; and the external terminal $SNS_N$[i], which functions as the outer lead of the lead 530D, is connected via a fourth terminal 630D in the socket SCT to another part of the wiring pattern 620. In FIG. 22, the terminals in the socket SCT are each conceptually indicated by a broken-line ellipse.

FIG. 22 shows a state of the leads 530A to 530D to which a lead-to-lead short-circuiting technology is not applied, and in the state in FIG. 22, the leads 530A and 530C are not connected together within the package, and nor are the leads 530B and 530D. In FIG. 22, the two arrows marked in the areas of the terminals 630A and 630B indicate the directions of the flow of a test current $I_{TEST}$ (see FIG. 16) in the test procedure. During the test procedure performed in the state in FIG. 22, the voltage $V_{TEST}$[i] sensed at step S14 in FIG. 16 includes not only the voltage drop across the sense wire 560 but also the voltage drops due to the contact resistances at the terminals 630A and 630B. The contact resistances at the terminals 630A and 630B can have resistance values that cannot be ignored compared with the resistance of the sense wires 560, and also vary in many ways. For example, while the sense resistor $R_{SNS}$[i] formed with the sense wires 560 has a resistance value of about 10 mΩ, the contact resistance at each of the terminals 630A and 630B may vary from several milliohms to about 100 mΩ. The presence of those contact resistances hampers the acquisition of desired calibration information and thereby makes it difficult to sense the coil current IL[i] accurately in the operating state.

Figure 23:
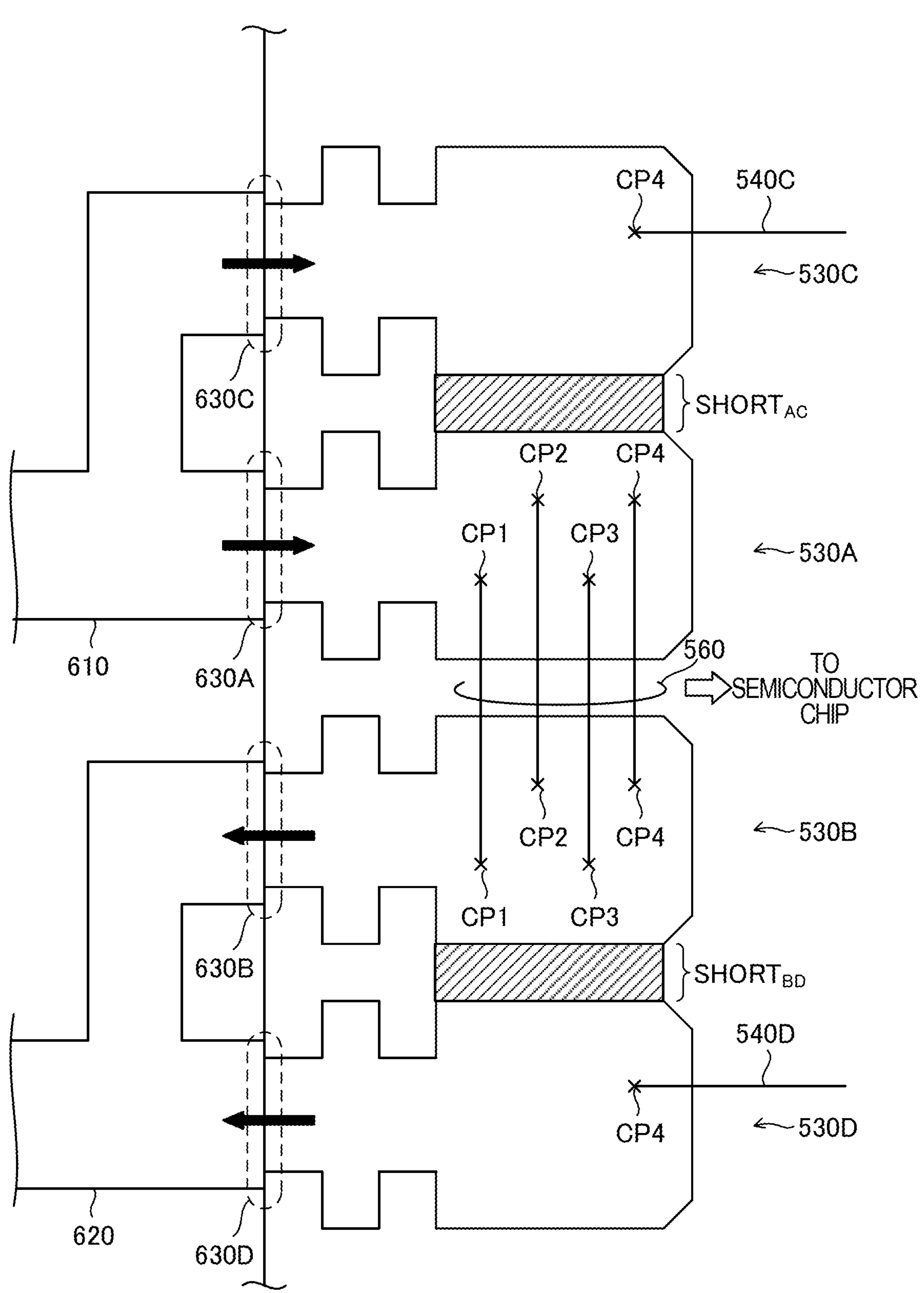
FIG. 23 is a plan view of and around a plurality of leads involved in current sensing, showing the flows of currents, in connection with Practical EX1_4 belonging to the first embodiment of the present disclosure.

With the foregoing in mind, in this embodiment including Practical Example EX1_4, a lead-to-lead short-circuiting technology is applied to the semiconductor device 10. By the lead-to-lead short-circuiting technology according to Practical Example EX1_4, the leads 530A and 530C are short-circuited together, and the leads 530B and 530D are short-circuited together, each pair within the package without passing via the semiconductor chip 510. The lead-to-lead short-circuiting technology can be applied equally to the first to third phases. Using the variable i, a description will now be given of the lead-to-lead short-circuiting technology for the ith phase. FIG. 23 is a conceptual diagram of a state around the leads 530A to 530D in the testing state mentioned above, with the lead-to-lead short-circuiting technology applied. With the lead-to-lead short-circuiting technology applied to it, the semiconductor device 10 according to Practical Example EX1_4 includes a short-circuiting metal member $SHORT_{AC}$ for short-circuiting the leads 530A and 530C together within the package without passing via the semiconductor chip 510 and a short-circuiting metal member $SHORT_{BD}$ for short-circuiting the leads 530B and 530D together within the package without passing via the semiconductor chip 510. In FIG. 23, for convenience' sake, those short-circuiting metal members are each indicated by a hatched area.

The short-circuiting metal member $SHORT_{AC}$ is a metal member that integrally couples together the metal part 530_*p*4 of the lead 530A and the metal part 530_*p*4 of the lead 530C (for the significance of the metal part 530_*p*4, see Practical Example EX1_3: FIG. 18). The short-circuiting metal member $SHORT_{AC}$ is formed of the same material as the leads 530A and 530C. The lead 530A, the short-circuiting metal member $SHORT_{AC}$, and the lead 530C may be formed of a single piece of metal sheet. The dimension (thickness) of the short-circuiting metal member $SHORT_{AC}$ in the Z-axis direction may be equal to the dimension (thickness) of the leads 530A and 530C (in particular the metal parts 530_*p*4 of the leads 530A and 530C) in the Z-axis direction.

A similar description applies to the short-circuiting metal member $SHORT_{BD}$. Specifically, the short-circuiting metal member $SHORT_{BD}$ is a metal member that integrally couples together the metal part 530_*p*4 of the lead 530B and the metal part 530_*p*4 of the lead 530D. The short-circuiting metal member $SHORT_{BD}$ is formed of the same material as the leads 530B and 530D. The lead 530B, the short-circuiting metal member $SHORT_{BD}$, and the lead 530D may be formed of a single piece of metal sheet. The dimension (thickness) of the short-circuiting metal member $SHORT_{BD}$ in the Z-axis direction may be equal to the dimension (thickness) of the leads 530B and 530D (in particular the metal parts 530_*p*4 of the leads 530B and 530D) in the Z-axis direction.

The dimension (thickness) of the short-circuiting metal members $SHORT_{AC}$ and $SHORT_{BD}$ in the Z-axis direction is significantly larger (e.g., 200 μm) than the diameter (e.g., 30 μm) of each sense wire 560, and also the dimension (width) of the short-circuiting metal members $SHORT_{AC}$ and $SHORT_{BD}$ in the center axis AX direction (see FIG. 18) is significantly larger than the diameter of each sense wire 560. Accordingly, the resistance value of each of the short-circuiting metal members $SHORT_{AC}$ and $SHORT_{BD}$ per unit length in the array direction of the leads 530A to 530D (i.e., in the X- or Y-axis direction) is significantly lower (negligibly low) than the resistance value of the sense resistor $R_{SNS}$[i] composed of $N_A$ sense wires 560 per unit length (in FIG. 23, the resistance value of the parallel-connected circuit of four sense wires 560). As mentioned above, $N_A$ represents any integer of one or more. Moreover, with respect to the array direction of the leads 530A to 530D, the dimension of each of the short-circuiting metal members $SHORT_{AC}$ and $SHORT_{BD}$ is smaller than the dimension of each sense wire 560. Accordingly, the resistance value (e.g., about 10 μΩ) of each of the short-circuiting metal members $SHORT_{AC}$ and $SHORT_{BD}$ is significantly lower than the resistance value (e.g., about 5 mΩ) of the sense resistor $R_{SNS}$[i] composed of $N_A$ sense wires 560.

In FIG. 23, the four arrows marked in the areas of the terminals 630A to 630D indicate the directions of the flow of a test current $I_{TEST}$ (see FIG. 16) in the test procedure. During the test procedure performed in the state in FIG. 23, the voltage $V_{TEST}$[i] sensed at step S14 in FIG. 16 includes substantially no voltage drop components due to the contact resistances at the terminals 630A and 630B. This is because the potential at the lead 530A is applied directly to the lead 530C via the short-circuiting metal member $SHORT_{AC}$ without passing via the socket SCT and the potential at the lead 530B is applied directly to the lead 530D via the short-circuiting metal member $SHORT_{BD}$ without passing via the socket SCT. It is thus possible to acquire desired calibration information in the test procedure, and to sense the coil current IL[i] accurately in the operating state.

With the lead-to-lead short-circuiting technology applied, a current (the test current $I_{TEST}$ or the coil current IL[i]) is expected to flow not only through the leads 530A and 530B but also through the leads 530C and 530D. This however does not pose a problem and rather provides an advantage: on the circuit board SUB, a wiring pattern across which the coil current IL[i] flows can be expanded to two external terminals. Moreover, in the operating state, even if, due to an error in wiring or the like, the external terminal $SNS_P$[i] or $SNS_N$[i] is left unconnected to the circuit board SUB, it is possible to sense the coil current IL[i] correctly.

Practical Example EX1_5

Practical Example EX1_5 will be described. A brief description will be given of an example of a procedure for fabricating the semiconductor device 10 by MAP (molded array packaging). In MAP, a plurality of semiconductor chips on a lead frame are sealed all together in sealing resin and are afterwards cut into individual semiconductor devices each including one semiconductor chip.

For the fabrication of the semiconductor device 10, a lead frame (not illustrated) is prepared. As is well known, a lead frame for use in MAP is a molded metal sheet that includes a plurality of die pads 520 on which to form a plurality of semiconductor devices 10, a lead metal part out of which to form a plurality of leads 530, and a support metal part for supporting those. In a dicing process, which will be described later, the support metal part is removed, and also the unnecessary parts of the lead metal part are removed to form a plurality of leads 530 separate from each other.

The processes involved are as follows. First, in a bonding process, semiconductor chips 510 are bonded (die-bonded) respectively to the pads 520 on the lead frame with a bonding material in between, and subsequently chip-directed wires 540 and sense wires 560 are connected (wire-bonded) to wherever desired. Thereafter, in a sealing process, the lead frame is set on a metal mold, and all the semiconductor chips 510 on the lead frame are, along with the lead frame, the chip-directed wires 540, and the sense wires 560 sealed all together in sealing resin (corresponding to the sealing resin 550 in FIG. 7). Next, a plated layer is formed on a metal surface of each lead 530 that is to function as an external terminal, and then, in a dicing process, the lead frame is cut along predetermined dicing lines into individual semiconductor devices 10. Thereafter, through the pre-shipment inspection procedure including the test procedure (see FIG. 16) described above, the semiconductor device 10 is completed, ready for incorporation in a motor driving system SYS.

Where the lead-to-lead short-circuiting technology described above is applied, the lead frame just mentioned can include the short-circuiting metal members ($SHORT_{ac}$ and $SHORT_{bd}$, or $SHORT_{AC}$ and $SHORT_{BD}$).

Practical Example EX1_6

Practical Example EX1_6 will be described. In the following description, the lead 530 (e.g., 530*a*, 530A) that constitutes the external terminal $OUT_{IN}$[i] is occasionally referred to specifically as the first target lead 530, and the lead 530 (e.g., 530*b*, 530B) that constitutes the external terminal $OUT_O$[i] is occasionally referred to specifically as the second target lead 530 (see FIGS. 10A and 21). Likewise, the lead 530 (e.g., 530*c*, 530C) that constitutes the external terminal $SNS_P$[i] is occasionally referred to specifically as the third target lead 530, and the lead 530 (e.g., 530*d*, 530D) that constitutes the external terminal $SNS_N$[i] is occasionally referred to specifically as the fourth target lead 530 (see FIGS. 10A and 21). The semiconductor device 10 includes three sets (for three phases) of first to fourth target leads 530.

While in the configurations described above the first and second target leads 530 are disposed adjacent to each other, that is, no other lead 530 is interposed between the first and second target leads 530 (see FIGS. 10A and 21), one or more other leads 530 may be interposed (disposed) between the first and second target leads 530.

Second Embodiment

A second embodiment of the present disclosure will be described. The second embodiment, and also the third and fourth embodiments described later, are based on the first embodiment, and for any features that are not specifically described in connection with the second to fourth embodiments, unless inconsistent, the description given in connection with the first embodiment is applied equally to the second to fourth embodiments. In interpreting the second embodiment, for any features that contradict between the first and second embodiments, those described in connection with the second embodiment may prevail (the same applies to the third and fourth embodiments described later). Unless inconsistent, any two or more of the first to fourth embodiments may be implanted in combination.

While, as mentioned above, a lead-to-lead short-circuiting technology brings useful effects, so long as the contact resistances between the terminals in the socket SCT and the external terminals of the semiconductor device during the acquisition of calibration information can be held low, no lead-to-lead short-circuiting technology may be applied.

Figure 24:
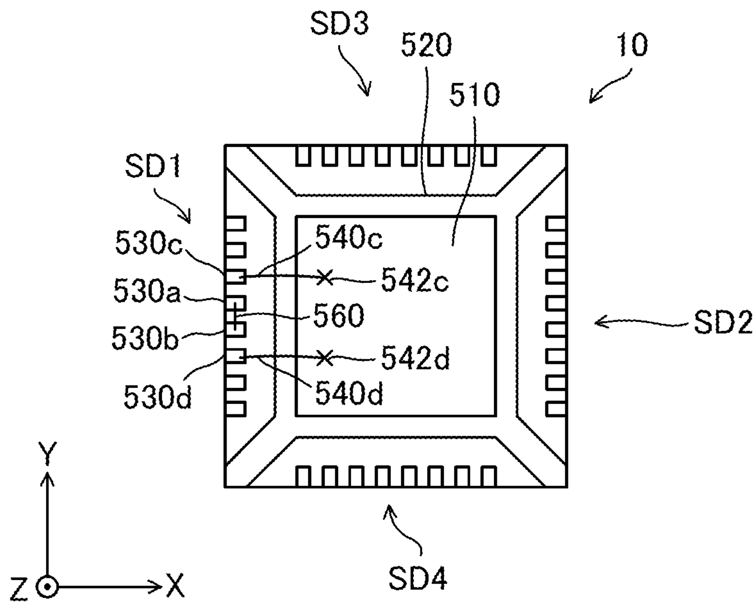
FIG. 24 is a transparent plan view of a semiconductor device in connection with a second embodiment of the present disclosure.

Specifically, the short-circuiting metal members may be omitted from the semiconductor device 10 according to the first embodiment. More specifically, the short-circuiting metal members $SHORT_{ac}$ and $SHORT_{bd}$ may be omitted from the configuration of the semiconductor device 10 in FIGS. 10A and 10B (the same applies to the semiconductor device 10 in FIG. 13 or 14). FIG. 24 is an example of a transparent plan view of the semiconductor device 10 according to the second embodiment with the sealing resin 550 assumed to be transparent. While FIG. 24 shows one sense wire 560, also in the second embodiment, there may be provided any number, one or more, of sense wires 560.

In a case where the short-circuiting metal members $SHORT_{ac}$ and $SHORT_{bd}$ are omitted from the configuration of the semiconductor device 10 in FIGS. 10A and 10B, for the first phase, of sides SD1 to SD4, the side along which the leads 530*a* and 530*c* are provided (i.e., the side along which the external terminals $OUT_{IN}$[1] and $OUT_{O}$[1] are provided) may be different from the side along which the lead 530*c* or 530*d* is provided (i.e., the side along which the external terminal $SNS_{P}$[1] or $SNS_{N}$[1] is provided). For example, for the first phase, it is possible to provide the leads 530*a* and 530*b* along side SD1 and the leads 530*c* and 530*d* along side SD3, or to provide the leads 530*c* and 530*d* along sides SD3 and SD4 respectively. The same applies to the second and third phases.

The semiconductor device 10 shown in FIGS. 21 and 22 is an example of the semiconductor device 10 according to the second embodiment.

Third Embodiment

A third embodiment of the present disclosure will be described.

Figure 25:
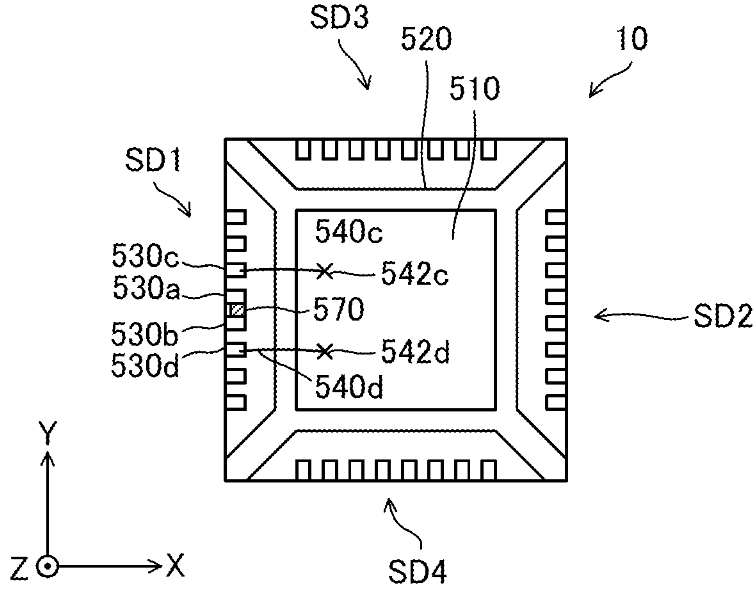
FIG. 25 is a transparent plan view of a semiconductor device in connection with a third embodiment of the present disclosure.

In the third embodiment, the sense resistor $R_{SNS}$[i] is formed not with a sense wire but with a coupling metal part. FIG. 25 shows, as an example of a coupling metal part, a coupling metal part 570. In FIG. 25, for convenience' sake, the coupling metal part is indicated by a hatched region (the same applies to FIGS. 26 and 27 referred to later). The coupling metal part is an example of a sensing metal member for forming the sense resistor $R_{SNS}$[i]. The coupling metal part is formed integrally with a first and a second target lead 530 (in FIG. 25, leads 530*a* and 530*b*), and couples together the first and second target leads 530 within the package. The coupling metal part is formed of the same material as the first and second target leads 530, and the first and second target leads 530 and the coupling metal part may be formed of a single piece of metal sheet.

In the semiconductor device 10 in FIG. 25, the coupling metal part 570 formed integrally with the lead 530*a* as an example of the first target lead 530 and the lead 530*b* as an example of the second target lead 530 is provided in place of a sense wire 560 (see FIG. 10A). As mentioned in connection with the first embodiment, the leads 530*a* and 530*b* are two leads 530 adjacent to each other, and the leads 530*a* and 530*b* constitute the external terminals $OUT_{IN}$[i] and $OUT_{O}$[i].

Figure 26:
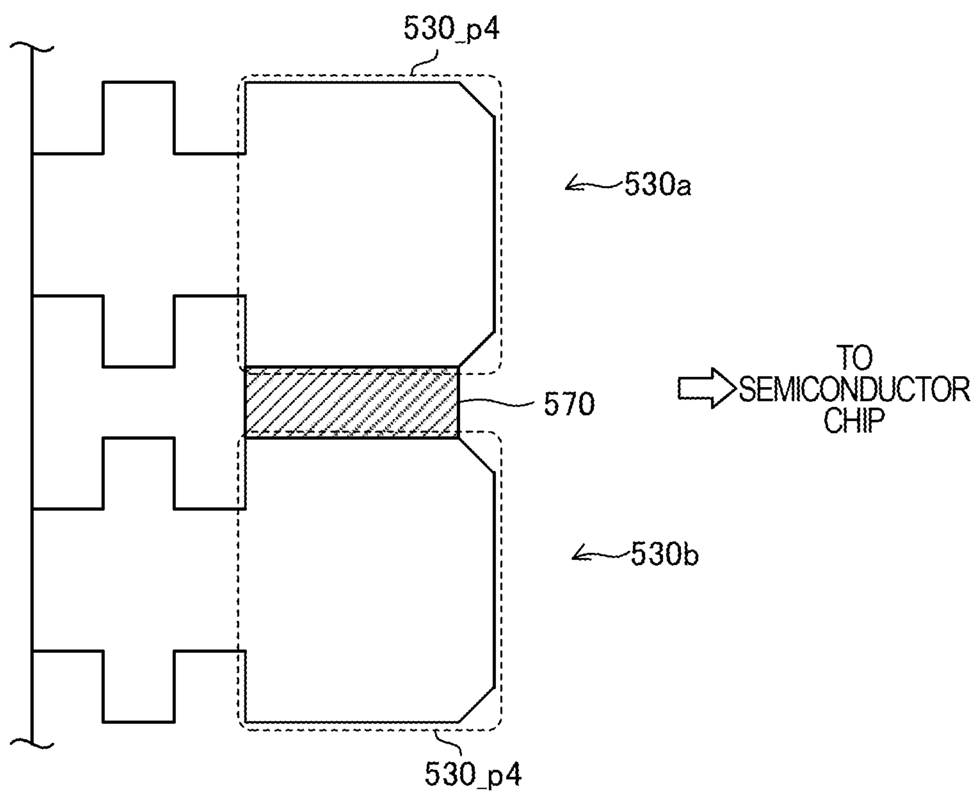
FIG. 26 is a plan view of two leads and a coupling metal part in connection with the third embodiment of the present disclosure.

The coupling metal part 570 can be a metal sheet with a thickness (dimension in the Z-axis direction) equal or substantially equal to the thickness (dimension in the Z-axis direction) of the leads 530*a* and 530*b*, and its thickness is, for example, 200 μm. In a case where each lead 530*a* is given a shape as shown in FIG. 18, then as shown in FIG. 26 a metal sheet that couples together the metal part 530_*p*4 of the lead 530*a* and the metal part 530_*p*4 of the lead 530*b* in the array direction of the leads 530*a* and 530*b* can be used as the coupling metal part 570. In this case, the coupling metal part 570 can be given a thickness (dimension in the Z-axis direction) equal or substantially equal to the thickness (dimension in the Z-axis direction) of the metal parts 530_*p*4 of the leads 530*a* and 530*b*.

In a case where the semiconductor device 10 has a 5 mm or so square QFN package, though depending on the shapes and sizes of the leads 530*a* and 530*b* and the coupling metal part 570, the resistance component present from the external terminal $OUT_{IN}$[i] via the coupling metal part 570 to the external terminal $OUT_{O}$[i] is about several hundred microhms. If the resistance element is 0.35 mΩ, passing a current of 100 A through it causes a voltage drop of 35 mV between the external terminals $OUT_{IN}$[i] and $OUT_{O}$[i]. Thus a configuration like the one shown in FIG. 25 is particularly useful in a system where a current of about 100 A or over is passed between the external terminals $OUT_{IN}$[i] and $OUT_{O}$[i].

Figure 27:
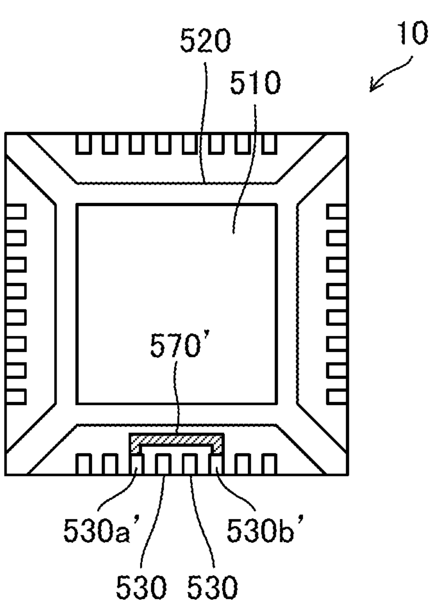
FIG. 27 is a transparent plan view of a modified semiconductor device in connection with the third embodiment of the present disclosure.

The first and second target leads 530 that are coupled together by the coupling metal part need not be adjacent to each other. For example, as shown in FIG. 27, leads 530*a*' and 530*b*' that are not adjacent to each other may be coupled together by a coupling metal part 570'. The lead 530*a*' is an example of the lead 530 constituting the external terminal $OUT_{IN}$[i] (i.e., the first target lead 530), and the lead 530*b*' is an example of the lead 530 constituting the external terminal $OUT_{O}$[i] (i.e., the second target lead 530). The leads 530*a*' and 530*b*' are provided along the same side (one of sides SD1 to SD4) of the semiconductor device 10, and along that same side, one or more other leads 530 (in FIG. 27, two other leads 530) are interposed (disposed) between the leads 530*a*' and 530*b*'. The coupling metal part 570' is formed integrally with the leads 530*a*' and 530*b*' while circumventing those other leads 530 within the package.

The coupling metal part 570' can be a metal sheet with a thickness (dimension in the Z-axis direction) equal or substantially equal to the thickness (dimension in the Z-axis direction) of the leads 530*a*' and 530*b*', and its thickness is, for example, 200 μm. By increasing or decreasing the number of other leads 530 provided between the leads 530*a*' and 530*b*', it is possible to increase or decrease the resistance value of the sense resistor $R_{SNS}$[i] formed with the coupling metal part 570'. Also by adjusting the width of the coupling metal part 570' (the dimension of the coupling metal part 570' in the direction orthogonal to both the array direction of the leads 530*a*' and 530*b*' and Z axis), it is possible to adjust the resistance value of the sense resistor $R_{SNS}$[i]. Wire-bonding may be difficult between a lead 530 provided between the lead 530*a*' and 530*b*' and the semiconductor chip 510; accordingly any lead 530 provided between the leads 530*a*' and 530*b*' may be left as a lead 530 unconnected to the semiconductor chip 510 (i.e., as a lead 530 that constitutes an NC terminal).

As described above, in the semiconductor device 10 according to the third embodiment, a coupling metal part (570, 570') is disposed in a peripheral part of the semiconductor chip 510 and the die pad 520 so that a first and a second target lead 530 are connected together by the coupling metal part (570, 570') without passing via the semiconductor chip 510.

In the fabrication procedure of semiconductor device 10, the coupling metal part (570, 570') is included in the lead frame mentioned above; that is, a lead frame that integrally includes the first and second target leads 530 and the coupling metal part (570, 570') is prepared, and through the bonding process, sealing process, dicing process, and pre-shipment inspection procedure described above, an individual semiconductor device 10 is completed.

The lead-to-lead short-circuiting technology described above may or may not be applied to the semiconductor device 10 according to the third embodiment. FIGS. 25 to 27 disregard whether the lead-to-lead short-circuiting technology is applied.

Fourth Embodiment

A fourth embodiment of the present disclosure will be described.

The channel type of any FET (field-effect transistor) used in any embodiment is only illustrative: the configuration of any circuit including any FET may be modified such that an N-channel FET is replaced with a P-channel FET or a P-channel FET is replaced with an N-channel FET.

Unless any inconvenience arises, any of the transistors mentioned above may be of any type. For example, unless any inconvenience arises, any transistor mentioned above as a MOSFET may be replaced with a junction FET, an IGBT (insulated-gate bipolar transistor), or a bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

Semiconductor devices (10) according to the present disclosure may be used for any other purposes than the driving of three-phase motors. Semiconductor devices (10) according to the present disclosure are useful in applications that involve the sensing of a current of any type flowing across any wiring (e.g., a current flowing through a coil in a single-phase motor, or a current flowing through a switching element, coil, or output terminal in a switching power supply circuit).

Notes

To follow is a study on the technical ideals that underlie the embodiments described above.

According to one aspect of the present disclosure, a semiconductor device (10) includes: a semiconductor chip (510) on which a semiconductor integrated circuit is formed; a plurality of leads (530) disposed around the semiconductor chip; two or more chip-directed wires (540) connecting two or more leads included in the plurality of leads to the semiconductor chip; and a package including a sealing resin (550) and sealing the semiconductor chip, the plurality of leads, and the two or more chip-directed wires such that part of each of the plurality of leads is exposed out of the sealing resin. The semiconductor integrated circuit includes: a current sensing circuit (110) configured to sense a sensing target current (IL[i]) flowing through a sense resistor ($R_{SNS}$[i]) based on the voltage drop across the sense resistor; and a main circuit (120 and 130) configured to perform predetermined operation based on the result of sensing of the sensing target current. The plurality of leads include a first lead and a second lead (530*a* and 530*b*, or 530A and 530B, or 530*a*' and 530*b*') connected to one end and the other end, respectively, of the sense resistor. The sense resistor is formed by use of a sensing metal member (560, 570, or 570') that connects between the first and second leads within the package without passing via the semiconductor chip. (A first configuration.)

In the configuration example in FIG. 1, the main circuit includes a control circuit 120 and a pre-driver circuit 130. This, however, is not meant as any limitation on the main circuit: the main circuit may perform any operation. For example, take a bucking (stepping-off) switching power supply circuit that generates an output voltage by generating a rectangular-wave switching voltage through switching of an input voltage with an output transistor and then rectifying and smoothing the switching voltage with a rectifying-smoothing circuit including a coil and an output capacitor; consider a case where a semiconductor device according to the present disclosure is employed as one of the components of that switching power supply circuit. In this case, the current that flows through the output transistor or the current that flows through the coil in the rectifying-smoothing circuit is handled as the sensing target current, and the main circuit in the semiconductor device can perform, as the predetermined operation, switching with the output transistor based on the result of the sensing of the sensing target current.

In the semiconductor device of the first configuration described above, specifically, the plurality of leads may further include a third lead and a fourth lead (530*c* and 530*d*, or 530C and 530D) to be short-circuited to the first and second leads, respectively, on a circuit board (SUB) on which the semiconductor device is to be mounted. The two or more chip-directed wires may include a first chip-directed wire (540*c* or 540C) that connects the third lead to the semiconductor chip and a second chip-directed wire (540*d* and 540D) that connects the fourth lead to the semiconductor chip. The current sensing circuit may be configured to sense the sensing target current base on a potential difference between the connection point (542*c*) between the semiconductor chip and the first chip-directed wire and the connection point (542*d*) between the semiconductor chip and the second chip-directed wire. (A second configuration.)

In the semiconductor device of the second configuration described above, the current sensing circuit may be configured to sense the sensing target current based on, as well as the potential difference, calibration information previously set according to the actual resistance value of the sensing metal member. (A third configuration.)

In the semiconductor device of the third configuration described above, the current sensing circuit may be configured to sense the sensing target current based further on a signal reflecting the temperature in the package. (A fourth configuration.)

In the semiconductor device of any of the first to fourth configurations described above, the sensing metal member may be configured with one or more sense wires. (A fifth configuration.)

In the semiconductor device of the fifth configuration described above, there may be further provided, within the package: a first short-circuiting metal member that short-circuits between the first and third leads without passing via the semiconductor chip; and a second short-circuiting metal member that short-circuits between the second and fourth leads without passing via the semiconductor chip. (A sixth configuration.)

In the semiconductor device of the sixth configuration described above, the short-circuiting metal members may each have a resistance value lower than the resistance value of the sensing metal member configured with the one or more sense wires. (A seventh configuration.)

In the semiconductor device of any of the first to fourth configurations described above, the sense resistor as the sensing metal member may be formed with a coupling metal part formed integrally with the first and second leads within the package. (An eighth configuration.)

In the semiconductor device of any of the first to eighth configurations described above, the first and second leads may be two leads adjacent to each other or one or more other leads may be disposed between the first and second leads. (A ninth configuration.)

According to another aspect of the present disclosure, a motor driving system (SYS) includes: a three-phase motor (30) having a first to a third coil (L[1] to L[3]); an inverter circuit (20) configured to supply each of the coils with an electric current; and the semiconductor device (10) according to any of the first to ninth configurations described above. The current sensing circuit (110) in the semiconductor device is configured to sense a first to a third sensing target current (IL[1] to IL[3]) flowing through a first to a third sense resistor ($R_{SNS}$[1] to $R_{SNS}$[3]) based on voltage drops across the first to third sense resistors. The first to third sensing target currents are currents that flow through the first to third coils. The semiconductor device includes three sets of the first and second leads and the sensing metal member, and each of the sense resistors is formed by use of the sensing metal member in one of the sets. The main circuit (120 and 130) in the semiconductor device is configured to control the inverter circuit based on the results of the sensing of the first to third sensing target currents. (A tenth configuration.)

Embodiments of the present disclosure can be modified in many ways as necessary without departure from the scope of the technical concepts defined in the appended claims. The embodiments described herein are merely examples of how the present disclosure can be implemented, and what is meant by any of the terms used to describe the present disclosure and its constituent elements is not limited to that mentioned in connection with the embodiments. The specific values mentioned in the above description are merely illustrative and needless to say can be modified to different values.

The invention claimed is:

1. A semiconductor device, comprising:

a semiconductor chip on which a semiconductor integrated circuit is formed;

a plurality of leads disposed around the semiconductor chip;

two or more chip-directed wires connecting two or more leads included in the plurality of leads to the semiconductor chip;

a package including a sealing resin, the package sealing the semiconductor chip, the plurality of leads, and the two or more chip-directed wires such that part of each of the plurality of leads is exposed out of the sealing resin, wherein the semiconductor integrated circuit includes:

a current sensing circuit configured to sense a sensing target current flowing through a sense resistor based on a voltage drop across the sense resistor; and a main circuit configured to perform predetermined operation based on a result of sensing of the sensing target current, the plurality of leads include a first lead connected to a first end of the sense resistor and a second lead connected to a second end of the sense resistor, the sense resistor is disposed within the package, the sense resistor is formed of a sensing metal member disposed to bridge between the first and second leads without passing through the semiconductor chip, and the first lead and the second lead are each connected to the semiconductor chip without passing via the sense resistor and without passing via a conductive member provided outside the package, the plurality of leads further includes a third lead and a fourth lead to be short-circuited to the first and second leads, respectively, on a circuit board on which the semiconductor device is to be mounted, the two or more chip-directed wires include a first chip-directed wire that connects the third lead to the semiconductor chip and a second chip-directed wire that connects the fourth lead to the semiconductor chip, the current sensing circuit is configured to sense the sensing target current based on a potential difference between a connection point between the semiconductor chip and the first chip-directed wire and a connection point between the semiconductor chip and the second chip-directed wire, within the package, one end of the first chip-directed wire is wire-bonded to a point on the third lead and another end of the first chip-directed wire is wire-bonded to a point on the semiconductor chip, and within the package, one end of the second chip-directed wire is wire-bonded to a point on the fourth lead and another end of the second chip-directed wire is wire-bonded to another point on the semiconductor chip.

2. The semiconductor device according to claim 1, wherein the current sensing circuit is configured to sense the sensing target current based on, as well as the potential difference, calibration information previously set according to an actual resistance value of the sensing metal member.

3. The semiconductor device according to claim 2, wherein the current sensing circuit is configured to sense the sensing target current based further on a signal reflecting a temperature in the package.

4. The semiconductor device according to claim 1, further comprising, within the package:

a first short-circuiting metal member that short-circuits between the first and third leads without passing via the semiconductor chip; and a second short-circuiting metal member that short-circuits between the second and fourth leads without passing via the semiconductor chip.

5. The semiconductor device according to claim 4, wherein the short-circuiting metal members each have a resistance value lower than a resistance value of the sensing metal member configured with one or more sense wires.

6. The semiconductor device according to claim 1, wherein the first and second leads are two leads adjacent to each other or one or more other leads are disposed between the first and second leads.

7. A motor driving system, comprising:

a three-phase motor having a first to a third coil;

an inverter circuit configured to supply each of the coils with an electric current; and the semiconductor device according to claim 1, wherein the current sensing circuit in the semiconductor device is configured to sense a first to a third sensing target current flowing through a first to a third sense resistor based on voltage drops across the first to third sense resistors, the first to third sensing target currents are currents that flow through the first to third coils, the semiconductor device includes three sets of the first and second leads and the sensing metal member, each of the sense resistors being formed by use of the sensing metal member in one of the sets, and the main circuit in the semiconductor device is configured to control the inverter circuit based on results of sensing of the first to third sensing target currents.

8. The semiconductor device according to claim 1, wherein the sensing metal member is configured with one or more sense wires.

9. The semiconductor device according to claim 1, wherein the sense resistor as the sensing metal member is formed with a coupling metal part formed integrally with the first and second leads within the package.

* * * * *